US012627277B2

(12) United States Patent
Roesler

(10) Patent No.: US 12,627,277 B2
(45) Date of Patent: May 12, 2026

(54) THIN-FILM SURFACE-ACOUSTIC-WAVE RESONATOR WITH ALUMINUM NITRIDE LAYER

(71) Applicant: RF360 SINGAPORE PTE. LTD., Republic Plaza (SG)

(72) Inventor: Ulrike Monika Roesler, Hebertshausen (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 157 days.

(21) Appl. No.: 18/504,094

(22) Filed: Nov. 7, 2023

(65) Prior Publication Data

US 2025/0150055 A1     May 8, 2025

(51) Int. Cl.
| | |
|---|---|
| *H03H 9/02* | (2006.01) |
| *H03H 3/08* | (2006.01) |
| *H03H 9/145* | (2006.01) |
| *H03H 9/25* | (2006.01) |
| *H03H 9/64* | (2006.01) |

(52) U.S. Cl.
CPC .......... *H03H 9/02574* (2013.01); *H03H 3/08* (2013.01); *H03H 9/02559* (2013.01); *H03H 9/14544* (2013.01); *H03H 9/25* (2013.01); *H03H 9/6483* (2013.01)

(58) Field of Classification Search
CPC ........... H03H 9/02574; H03H 9/02559; H03H 9/14544; H03H 9/25; H03H 9/6483
See application file for complete search history.

(56) References Cited

U.S. PATENT DOCUMENTS

| | | | |
|---|---|---|---|
| 2021/0288628 A1* | 9/2021 | Nishimura | ......... H03H 9/02834 |
| 2022/0038071 A1* | 2/2022 | Nakazato | .......... H03H 9/02157 |
| 2022/0094327 A1 | 3/2022 | Chen | |
| 2022/0123719 A1 | 4/2022 | Burak et al. | |
| 2022/0278667 A1* | 9/2022 | Yamamoto | ......... H03H 9/02897 |
| 2024/0113694 A1* | 4/2024 | Hurwitz | ................ H03H 9/605 |

OTHER PUBLICATIONS

International Search Report and Written Opinion—PCT/SG2024/050649—ISA/EPO—Jan. 17, 2025.

* cited by examiner

*Primary Examiner* — Samuel S Outten
(74) *Attorney, Agent, or Firm* — QUALCOMM Incorporated

(57)     ABSTRACT

An apparatus is disclosed for a surface-acoustic-wave device having an Aluminum Nitride substrate layer. In one aspect, a surface acoustic wave (SAW) includes a substrate layer comprising an Aluminum Nitride (AlN) substrate layer, an electrode structure comprising an interdigital transducer, and a piezoelectric layer disposed between the electrode structure and the substrate layer. In some aspects, the piezoelectric layer is Lithium Niobate or Lithium Tantalate.

28 Claims, 19 Drawing Sheets

TFSAW
DEVICE
600

IDT
608

Electrode
Structure
602

Piezoelectric
Layer 604

AlN Substrate
Layer 612

900A

Frequency [MHz]

Magnitude [dB]

1100D

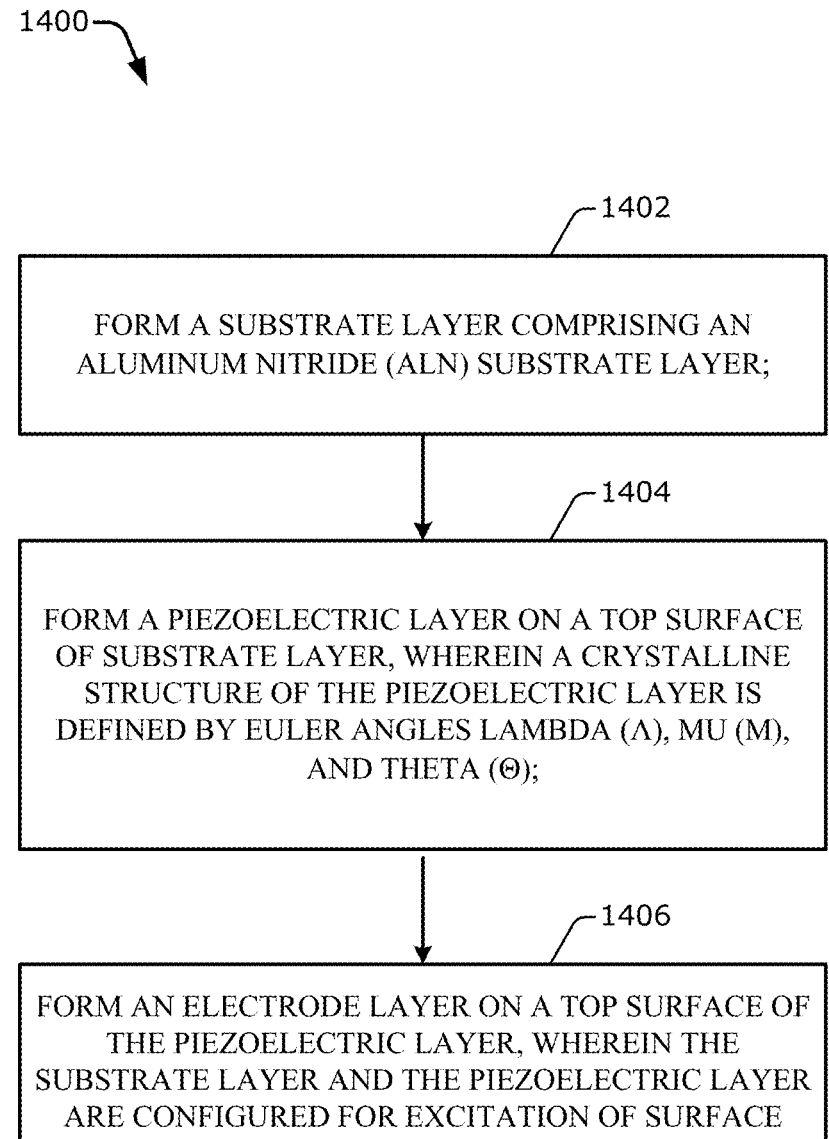

1400

1402

FORM A SUBSTRATE LAYER COMPRISING AN ALUMINUM NITRIDE (ALN) SUBSTRATE LAYER;

1404

FORM A PIEZOELECTRIC LAYER ON A TOP SURFACE OF SUBSTRATE LAYER, WHEREIN A CRYSTALLINE STRUCTURE OF THE PIEZOELECTRIC LAYER IS DEFINED BY EULER ANGLES LAMBDA (Λ), MU (M), AND THETA (Θ);

1406

FORM AN ELECTRODE LAYER ON A TOP SURFACE OF THE PIEZOELECTRIC LAYER, WHEREIN THE SUBSTRATE LAYER AND THE PIEZOELECTRIC LAYER ARE CONFIGURED FOR EXCITATION OF SURFACE WAVES, AND WHEREIN THE ALN SUBSTRATE LAYER IS CONFIGURED AS A FAST LAYER TO LIMIT EXCITATION OF SPURIOUS WAVES

FIG. 14

THIN-FILM SURFACE-ACOUSTIC-WAVE RESONATOR WITH ALUMINUM NITRIDE LAYER

TECHNICAL FIELD

This disclosure relates generally to filters and, more specifically, to surface-acoustic-wave (SAW) filters with an Aluminum Nitride layer (AlN) layer.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

An apparatus is disclosed that implements a surface-acoustic-wave (SAW) filter using an Aluminum Nitride layer (AlN) substrate layer.

In one aspect, an apparatus is provided. The apparatus is surface acoustic wave (SAW) filter apparatus comprising: a substrate layer comprising an Aluminum Nitride (AlN) substrate layer, an electrode structure comprising an interdigital transducer, the interdigital transducer having an input, an output, and a central track, and a piezoelectric layer disposed between the electrode structure and the substrate layer, where a crystalline structure of the piezoelectric layer is defined by Euler angles lambda ($\lambda$), mu ($\mu$), and theta ($\theta$), where the substrate layer and the piezoelectric layer are configured for excitation of selected electroacoustic wave modes confined by the AlN substrate layer to limit excitation spurious wave modes in a stack structure of the SAW filter apparatus.

Some such aspects are configured where the piezoelectric layer comprises Lithium Tantalate, and where the Euler angles for the piezoelectric layer are selected in a range from LT0 through LT60.

Another aspect is a resonator device. The resonator device comprises a SAW resonator that includes a glass support layer and a fast AlN layer disposed on the glass support layer. Aspects may also additionally comprise a slow layer disposed on the AlN layer. Aspects can further include an electrode structure comprising an interdigital transducer, and a piezoelectric layer disposed between the electrode structure and the fast layer.

Some such aspects are configured where the substrate layer and the piezoelectric layer are configured for excitation of surface waves. Some such aspects are configured where a slow layer is an SiO2 layer configured to limit excitation of spurious surface waves.

Another aspect is a method. The method comprises forming a substrate layer comprising an Aluminum Nitride (AlN) substrate layer, forming a piezoelectric layer on a top surface of substrate layer, where a crystalline structure of the piezoelectric layer is defined by Euler angles lambda ($\lambda$), mu ($\mu$), and theta ($\theta$), and forming an electrode layer on a top surface of the piezoelectric layer, where the substrate layer and the piezoelectric layer are configured for excitation of surface waves, and where the AlN substrate layer is configured as a fast layer to limit excitation of spurious waves.

Another aspect is an apparatus. The apparatus is a surface acoustic wave (SAW) resonator comprising: a substrate layer comprising an Aluminum Nitride (AlN) substrate layer, an electrode structure comprising an interdigital transducer, and a piezoelectric layer disposed between the electrode structure and the substrate layer.

Some such aspects are configured where the substrate layer and the piezoelectric layer are configured for excitation of surface waves, and where the AlN substrate layer is configured as a fast layer to confine the wave energy to the top of the structure and to limit excitation of spurious surface waves. Some such aspects are configured where a thickness of the substrate layer is proportional to a pitch value for fingers of the interdigital transducer. Some such aspects are configured where the AlN substrate layer is a single crystal AlN layer.

Some such aspects are configured where the AlN substrate layer is a ceramic AlN layer. Some such aspects are configured where the AlN substrate layer is fabricated as a non-piezoelectric layer using ceramic material and unordered polycrystalline AlN or amorphous AlN.

Some such aspects are configured where the AlN substrate layer is a deposited thin film layer. Some such aspects are configured where the AlN substrate layer is doped with Scandium to adjust a velocity ($v_{sh}$) value. In some aspects, an AlN layer and an AlScN layer are used, with the AlScN layer on the electrode side of the AlN layer, such that the AlScN is between the AlN layer and the electrode layer. Some such aspects are configured where the substrate layer further comprises a glass support layer with the AlN substrate layer disposed between the piezoelectric layer and the glass support layer.

Some such aspects are configured where the substrate layer further comprises a glass support layer, where the AlN substrate layer is disposed between the glass support layer and the piezoelectric layer. Some such aspects are configured where the glass support layer is doped to match a thermal expansion coefficient of the glass support layer to a thermal expansion coefficient of the piezoelectric layer. Some such aspects are configured where the glass support layer is formed of amorphous SiO2. Some such aspects are configured where the glass support layer is formed of crystalline SiO2.

Some such aspects are configured where piezoelectric layer comprises lithium tantalate (LT), where a crystalline structure of the piezoelectric layer is defined by Euler angles lambda ($\lambda$), mu ($\mu$), and theta ($\theta$). Some such aspects are configured where the p value is in a range from −80 degrees to −30 degrees. Some such aspects are configured where the piezoelectric layer is in a configuration selected from LT0 through LT 60. Some such aspects are configured where the piezoelectric layer is in a configuration selected from LT25 through LT 50. Some such aspects are configured where a thickness of the piezoelectric layer is approximately 0.4 times a pitch value for fingers of the interdigital transducer. Some such aspects are configured where a thickness of the piezoelectric layer is between 0.2 and 0.8 times a pitch value for fingers of the interdigital transducer. Some such aspects are configured where a thickness of the AlN substrate layer is less than four times the pitch value.

Some such aspects further comprise an SiO2 compensation layer between the piezoelectric layer and the AlN substrate layer. Some such aspects are configured where the SiO2 compensation layer is approximately between 0.2 and 0.8 a pitch value for fingers of the interdigital transducer.

Some such aspects are configured where the piezoelectric layer comprises of lithium tantalate, and where the Euler angle is selected from a set of lithium tantalate Euler angles including of LT15, LT20, LT30, LT36, LT39, LT42, LT46.3, and LT50.

Some such aspects are configured where the piezoelectric layer and the interdigital transducer is configured to excite a particular shear polarized wave mode.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF DRAWINGS

FIG. 14 is a flow diagram illustrating an example process for fabricating a SAW resonator in accordance with aspects described herein.

DETAILED DESCRIPTION

Figure 1:
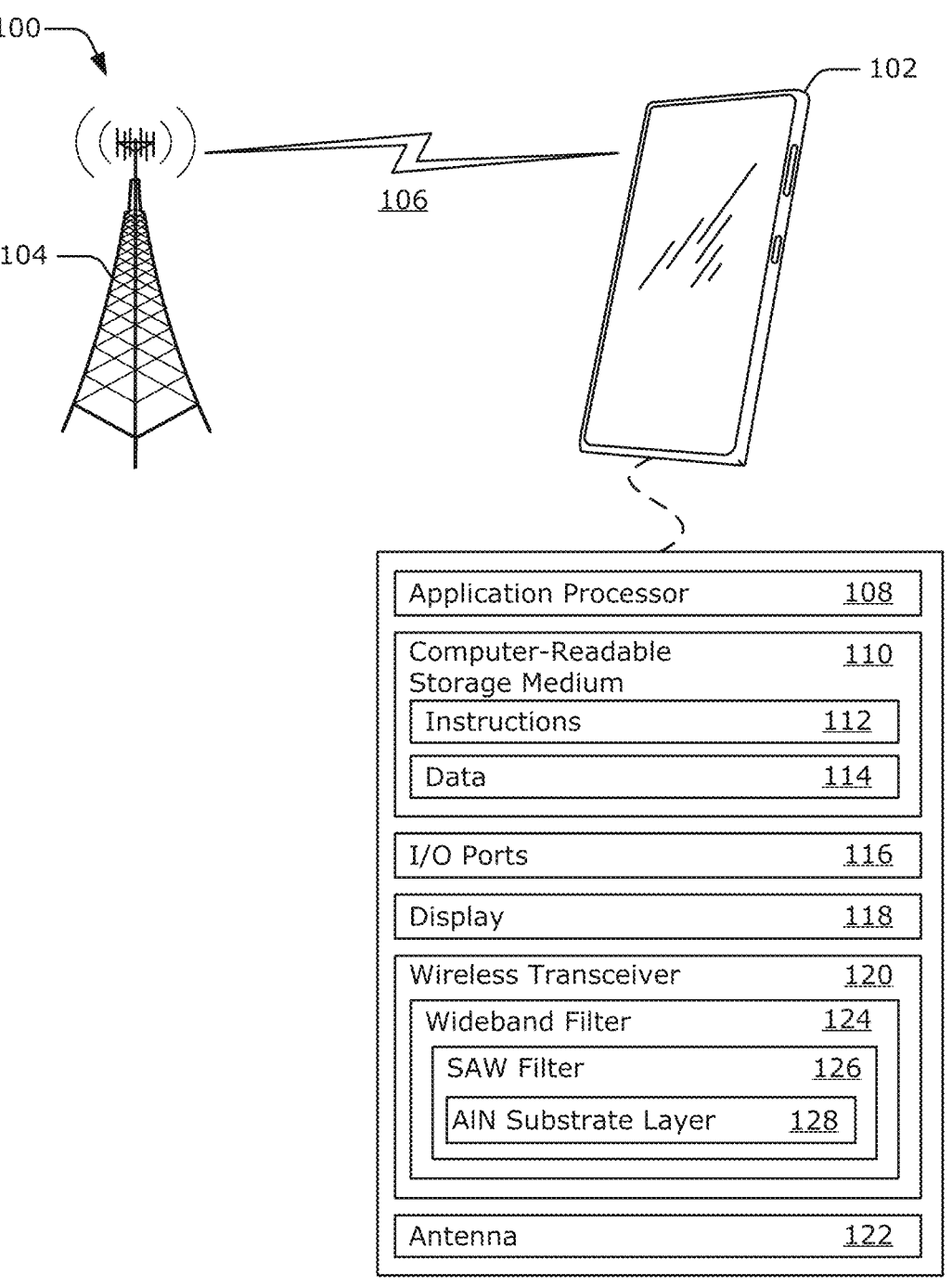
FIG. 1 illustrates an example operating environment for a surface-acoustic-wave (SAW) resonator in accordance with aspects described herein.

The detailed description set forth below in connection with the appended drawings is intended as a description of example implementations and is not intended to represent the only implementations in which the invention may be practiced. The detailed description includes specific details for the purpose of describing aspects of surface-acoustic-wave (SAW) devices, which can, in some aspects, be thin-film SAW (TFSAW) devices, with an Aluminum Nitride layer in accordance with aspects described herein. Alternative aspects which are not specifically detailed are possible within the scope of the described aspects.

Electroacoustic devices (e.g., "acoustic filters") can be used to filter high-frequency (e.g., generally greater than 100 MHz) signals in many applications. An acoustic filter is tuned to pass certain frequencies (e.g., frequencies within its passband) and reflect other frequencies (e.g., frequencies that are outside of its passband). Using a piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal.

The acoustic wave propagates across the piezoelectric material at a velocity that is significantly less than that of the propagation velocity of the electrical wave. Generally, the propagation velocity v of a wave is proportional to the wavelength lambda of the wave and depends on its frequency f (e.g., where velocity v=lambda*f). Consequently, after conversion of the electrical signal wave into the acoustic wave, the wavelength of the acoustic wave is significantly smaller than the wavelength of the electrical signal wave. The resulting smaller wavelength of the acoustic wave enables filtering to be performed using a smaller filter device. This permits acoustic filters to be used in space-constrained devices, including portable electronic devices such as cellular phones.

Surface-acoustic-wave (SAW) resonators are designed to cause propagation of an acoustic wave in a particular direction through the piezoelectric material (e.g., a main acoustic wave mode). However, due to the nature of the particular piezoelectric material used and the way the piezoelectric material is excited by signals interacting with an electrode structure, various acoustic wave modes in other directions may be generated. Electroacoustic devices with Lithium Tantalate (LT) or Lithium Niobate (LN) piezoelectric layers on a Silicon Oxide (SiO2) layer bonded to a Silicon (Si) carrier are common for high frequency acoustic filtering for wireless communications. Such devices, however, may have a number of tradeoffs. Despite high Q values at room temperature and sufficient coupling for many radio frequency bands, such devices can have wafer and device bowing connected with thermal expansion mismatches between Silicon and the piezoelectric materials (e.g., Si with an expansion coefficient of around 2.6 parts per million per degree Kelvin (ppm/K) mismatch with an example piezoelectric material's expansion coefficient of ~14-15 ppm/K). The thermal coefficient of frequency (TCF) can be different over frequency ranges (e.g., for resonance and antiresonance frequencies of a resonator), and thus for upper and lower band edges of filters, thermal variation can cause issues with filter operation at the edges at thermal boundaries. Use of Silicon substrates can additionally lead to passband breakdown effects at high power levels and/or higher temperatures due to semiconductor properties of silicon.

Aspects described herein include Aluminum Nitride in a substrate layer to improve device performance with better thermal matching of piezoelectric layers and substrate layers when compared with Silicon substrates. Additionally, device performance at high power levels and/or high temperatures is improved by avoiding semiconductor characteristics of Silicon substrates with the use of the AlN substrate layer.

In example implementations, the thin-film surface-acoustic-wave filter includes an electrode structure, a substrate layer, and a piezoelectric layer. The substrate layer is formed using an AlN layer in the substrate and a piezoelectric layer with a crystal orientation defined by Euler angles lambda (λ), mu (μ), and theta (θ). The AlN substrate acts as a high speed carrier layer to confine the wave energy to surface modes and limit parasitic modes besides the primary modes.

A single piezoelectric crystal is used in some filter resonator or wafer structures (e.g., a wafer composed out of one single crystalline (bulk) material). The crystal orientation of the piezoelectric layer can be defined by Euler angles. Some crystal orientations (e.g., corresponding to Euler angle ranges) are more useful than others, as they allow high excitation of only one mode with favorable characteristics for a filter operation. In some cases, a value of the Euler angles is defined for a given material, such as Euler angles (0, −60, 0) for LT30YX (LT—Lithium Tantalate), (0, −48, 0) for LT42YX or other Euler angles. In some aspects, manufacturing tolerances for such angles can be variations of less than 0.3 degrees. In some aspects, a piezoelectric layer is configured with selected Euler angles used to excite a mainly shear polarized wave (e.g., on LT or LN of a resonator) to achieve high electroacoustic coupling. In some aspects, particularly with a thick AlN layer (e.g., a ceramic layer which can also function as a heat sink), other Euler angles (e.g., piezoelectric cuts) can be used to excite a Rayleigh wave. Such aspects can target excitation of one main mode (e.g., Rayleigh or shear). Different Euler angle ranges can be used to select the mode.

Aspects described herein can use materials having crystallographic orientations defined by various standard Euler angles, such as those for lithium tantalate (LiTaO3/LT) 15(LT15), LT20, LT30, LT36, LT39, LT42, LT46.3, LT50, LT25, or other such angles. For thin-film SAW (TFSAW) devices, all LT cuts where a high coupling shear wave is primarily excited, can be used. A particular cut can be selected for a design depending on the layer thicknesses in the stack to optimize resonator or filter performance. In some aspects, the cut can be chosen to suppress excitation of an undesired Rayleigh wave for a given layer thickness combination and frequency range. The corresponding LT cuts may be chosen from LT10 . . . LT50 (e.g., LTxx with 10<~xx<~50 or other such angles). In some aspects, the Euler angles can be intentionally modified to shift the mu (μ) angle away from the standard angle to modify and adjust excitation of parasitic modes and to limit resonance spikes in TFSAW resonator operation. In some aspects, the third angle θ may also be varied by rotating the lithography mask used during fabrication to optimize operation for low losses in a particular implementation. This angle may also be varied directly when a single crystal wafer is prepared and a main notch is created to identify this angle. In a TFSAW structure, a design can also choose to rotate the marked direction away from the main crystal axis of the AlN or Si carrier wafer.

Various aspects of the present disclosure will be described with respect to the figures.

FIG. 1 illustrates an example environment 100 for wireless communications including devices operating with SAW using an AlN substrate layer in accordance with aspects described herein. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, a fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular, IEEE 802.11 (e.g., Wi-Fi™), IEEE 802.15 (e.g., Bluetooth™), IEEE 802.16 (e.g., WiMAX™), and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. Alternatively or additionally, the computing device 102 can include a wired transceiver, such as an Ethernet or fiber optic interface for communicating over a local network, intranet, or the Internet. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one filter 124 having one or more SAW resonators 126 (e.g., TFSAW resonators) fabricated using an AlN substrate layer 128. In some aspects, the AlN substrate layer 128 is a carrier layer within a substrate along with a glass (e.g., amorphous silicon oxide layer). In some aspects, the glass support substrate layer is doped to match a thermal expansion coefficient of other layers in a TFSAW resonator. In some aspects, a thin film SiO2 layer may also be presented to improve performance as described in more detail below.

Figure 2:
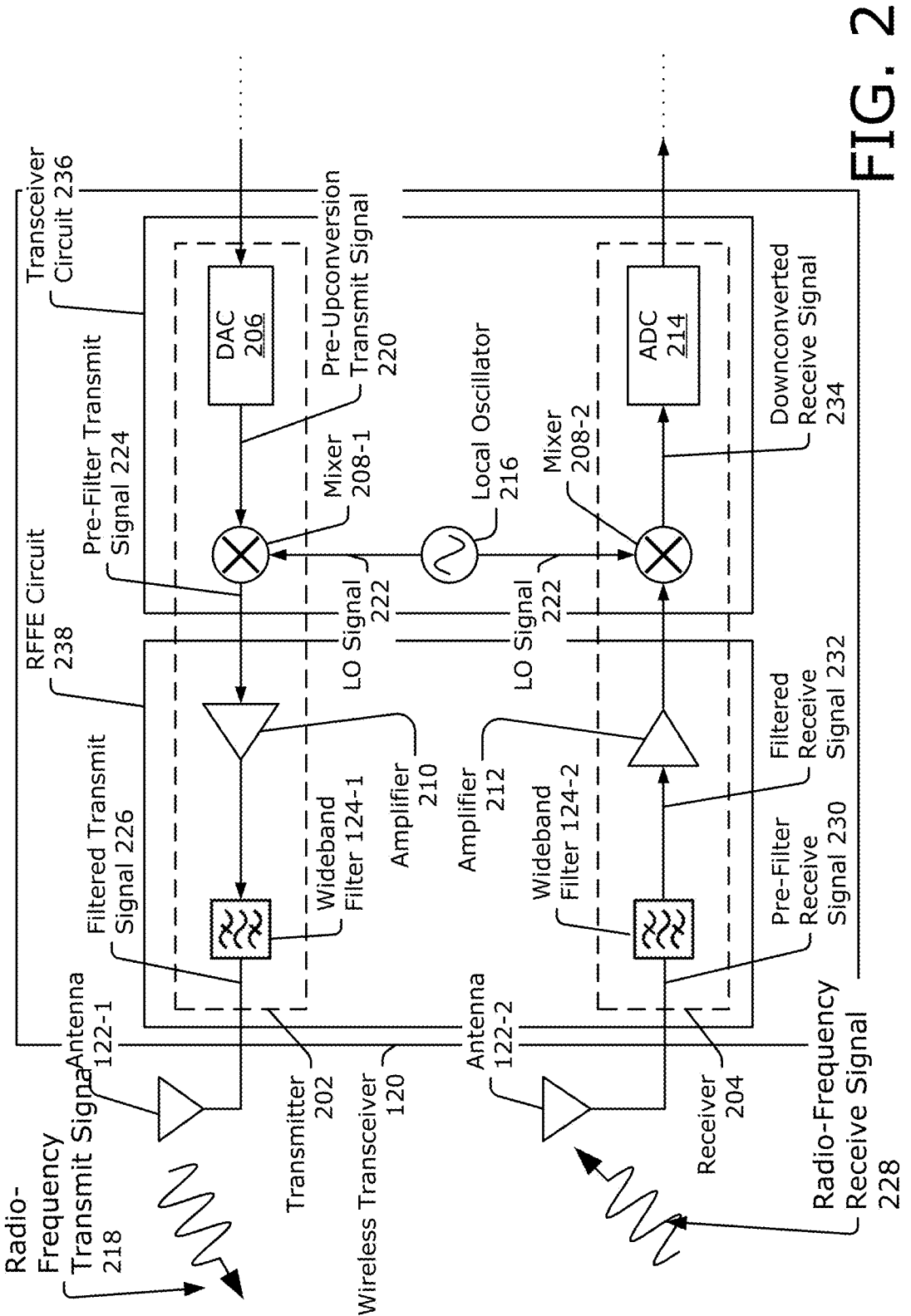
FIG. 2 illustrates an example wireless transceiver including filters implemented with SAW resonators in accordance with aspects described herein.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be selectively connected to a same antenna through a switch (not shown). The transmitter 202 is shown to include at least one digital-to-analog converter 206 (DAC 206), at least one first mixer 208-1, at least one amplifier 210 (e.g., a power amplifier), and at least one first wideband filter 124-1. The receiver 204 includes at least one second wideband filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits, such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the wideband filter 124-1 of the transmitter 202, the wideband filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some spurious (e.g., unwanted) frequencies, such as a harmonic frequency. The amplifier 210 amplifies the pre-filter transmit signal 224 and passes the amplified pre-filter transmit signal 224 to the wideband filter 124-1. The first wideband filter 124-1 filters the amplified pre-filter transmit signal 224 to generate a filtered transmit signal 226. As part of the filtering process, the first wideband filter 124-1 attenuates the one or more spurious frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second wideband filter 124-2 accepts the received radio-frequency receive signal 228, which is represented by a pre-filter receive signal 230. The second wideband filter 124-2 filters any spurious frequencies within the pre-filter receive signal 230 to generate a filtered receive signal 232. Example spurious frequencies can include jammers or noise from the external environment. The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem). The wideband filters 124-1 and 124-2 can be implemented by one or more thin-film surface-acoustic-wave resonators 126, an example of which is further described with respect to FIG. 3.

Figure 3:
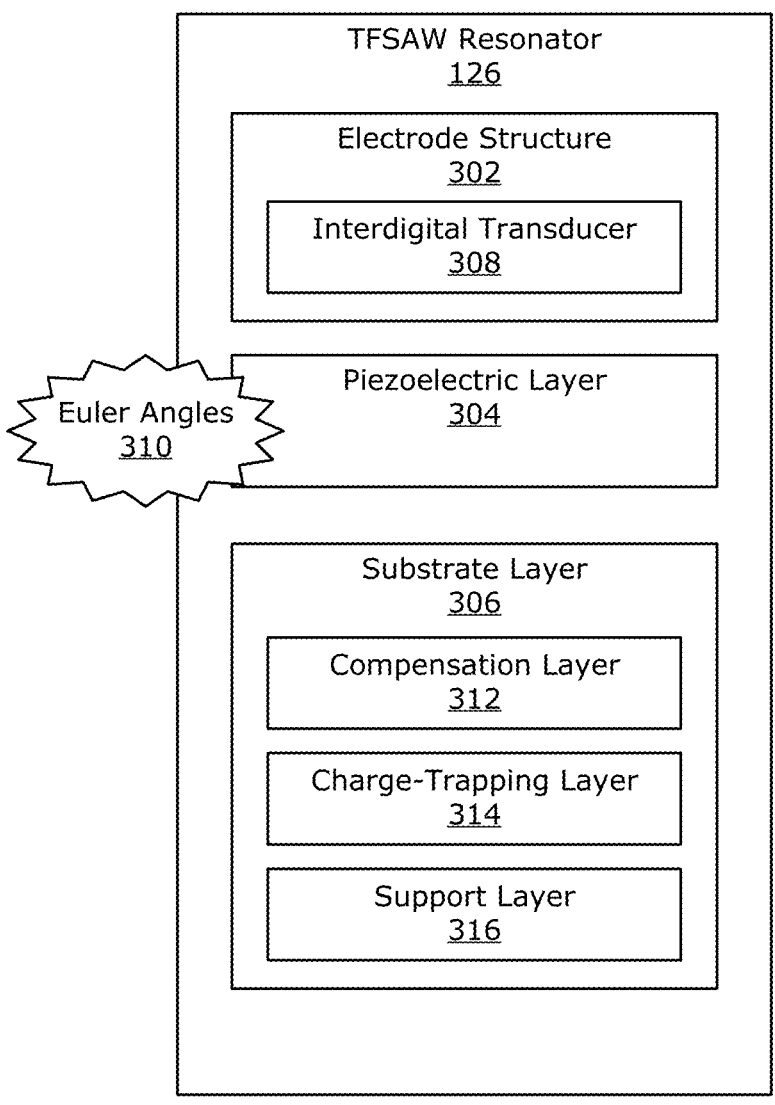
FIG. 3 illustrates aspects of a SAW device in accordance with aspects described herein.

FIG. 3 illustrates aspects of a TFSAW stack of the thin-film surface-acoustic-wave resonator 126. In the depicted configuration, the thin-film surface-acoustic-wave resonator 126 includes at least one electrode structure 302, at least one piezoelectric layer 304 (e.g., piezoelectric material), and at least one substrate layer 306. The electrode structure 302 comprises a conductive material, such as metal, and can include one or more layers. The one or more layers can include one or more metal layers and can optionally include one or more adhesion layers. As an example, the metal layers can be composed of aluminum (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 includes one or more interdigital transducers 308. The interdigital transducer 308 converts an electrical signal into an acoustic wave and converts the acoustic wave into a filtered electrical signal. One interdigital transducer (IDT) converts an electric signal into an acoustic wave, and has a strong frequency dependent admittance so the IDT functions as a basic structure for filtering. Some filters work with a combination of two or more IDTs, where one IDT excites the wave, which is received and converted back by one other IDT. Other filters use two or more IDTs with reflector fingers, and may only use the combination of the frequency dependent admittances to filter the electrical signal. In some systems, there may be a combination of multiple kinds of filtering in one device. Thus, as described above, an IDT such as the interdigital transducer 308 converts an electrical signal into an acoustic wave and/or converts the acoustic wave back into an electrical signal.

An example interdigital transducer 308 is further described below. Although not explicitly shown, the electrode structure 302 can also include two or more reflectors. In an example implementation, the interdigital transducer 308 is arranged between two reflectors, which reflect the acoustic wave back towards the interdigital transducer 308.

The material of the piezoelectric layer 304 and the orientation of the propagation surface with respect to the crystal structure of the material affects several performance parameters. Example performance parameters include an electroacoustic coupling factor ($K^2$), a temperature coefficient of frequency (TCF), a mode or type of acoustic wave produced, and/or a velocity of the acoustic wave. The electroacoustic coupling factor characterizes an efficiency of the thin-film surface-acoustic-wave resonator 126 in converting between electrical energy and mechanical energy. A filter with a higher electroacoustic coupling factor experiences less insertion loss over a wider frequency range and improved impedance matching than another filter with a lower electroacoustic coupling factor. The temperature coefficient of frequency characterizes an amount a resonant frequency or filter skirt of the filter changes in response to a change in temperature. A filter with a smaller absolute value of the temperature coefficient of frequency has a more stable frequency response over a range of temperatures compared to another filter with a larger absolute value of the temperature coefficient of frequency.

The substrate layer 306 can include one or more sublayers that can support charge trapping, temperature compensation, power handling, mode suppression, and so forth. In some aspects, the substrate layer 306 can be formed as an AlN substrate, and the piezoelectric layer 304 formed on a top surface of the AlN substrate layer (e.g., as described below with respect to FIG. 6. In other aspects, the AlN substrate layer 128 can be a sublayer with additional glass supporting layers, and an optional SiO2 layer between the AlN substrate layer and the piezoelectric layer (e.g., LT). Such a structure can provide waveguiding operation to emphasize surface wave modes and reduce spurious modes for certain implementations.

In some aspects, the substrate layer 306 can include at least one compensation layer 312, at least one charge-trapping layer 314, at least one support layer 316, or some combination thereof. These sublayers can be considered part of the substrate layer 306 or their own separate layers.

The compensation layer 312 can provide temperature compensation to enable the TFSAW resonator 126 to achieve the target temperature coefficient of frequency based on the thickness of the material in the piezoelectric layer 304. In some implementations, a thickness of the compensation layer 312 can be tailored to provide mode suppression (e.g., suppress the spurious plate mode). In example implementations, the compensation layer 312 can be implemented as the AlN substrate layer 128. In other implementations, $SiO_2$ or SiOF (e.g., Fluorine doped $SiO_2$) can be used as materials with intrinsically temperature compensating characteristics (e.g., stiffening under higher temperatures).

The charge-trapping layer 314 can suppress nonlinear substrate effects. The charge-trapping layer 314 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminum nitride (AlN) layer, or some combination thereof. In some aspects in accordance with implementations described herein, the charge-trapping layer 314 is optional and may not be present in some designs.

The support layer 316 can enable the acoustic wave to form across the surface of the piezoelectric layer 304 and reduce the amount of energy that leaks into the substrate layer 306. In some implementations, the support layer 316 can also act as a compensation layer 312. In general, the support layer 316 is composed of material that is non-conducting and provides isolation. For example, the support layer 316 can include at least one silicon (Si) layer (e.g., a doped high-resistive silicon layer), at least one sapphire layer, at least one silicon carbide (SiC) layer, at least one fused silica layer, at least one glass layer, at least one diamond layer, or some combination thereof. In other aspects, the support layer 316 can be AlN or AlN and glass. In some implementations, the support layer 316 has a relatively similar thermal expansion coefficient (TEC) as the piezoelectric layer 304. The support layer 316 can have a particular crystal orientation to support the suppression or attenuation of spurious modes, as further described with respect to FIG. 5.

Figures 4A, 4B:
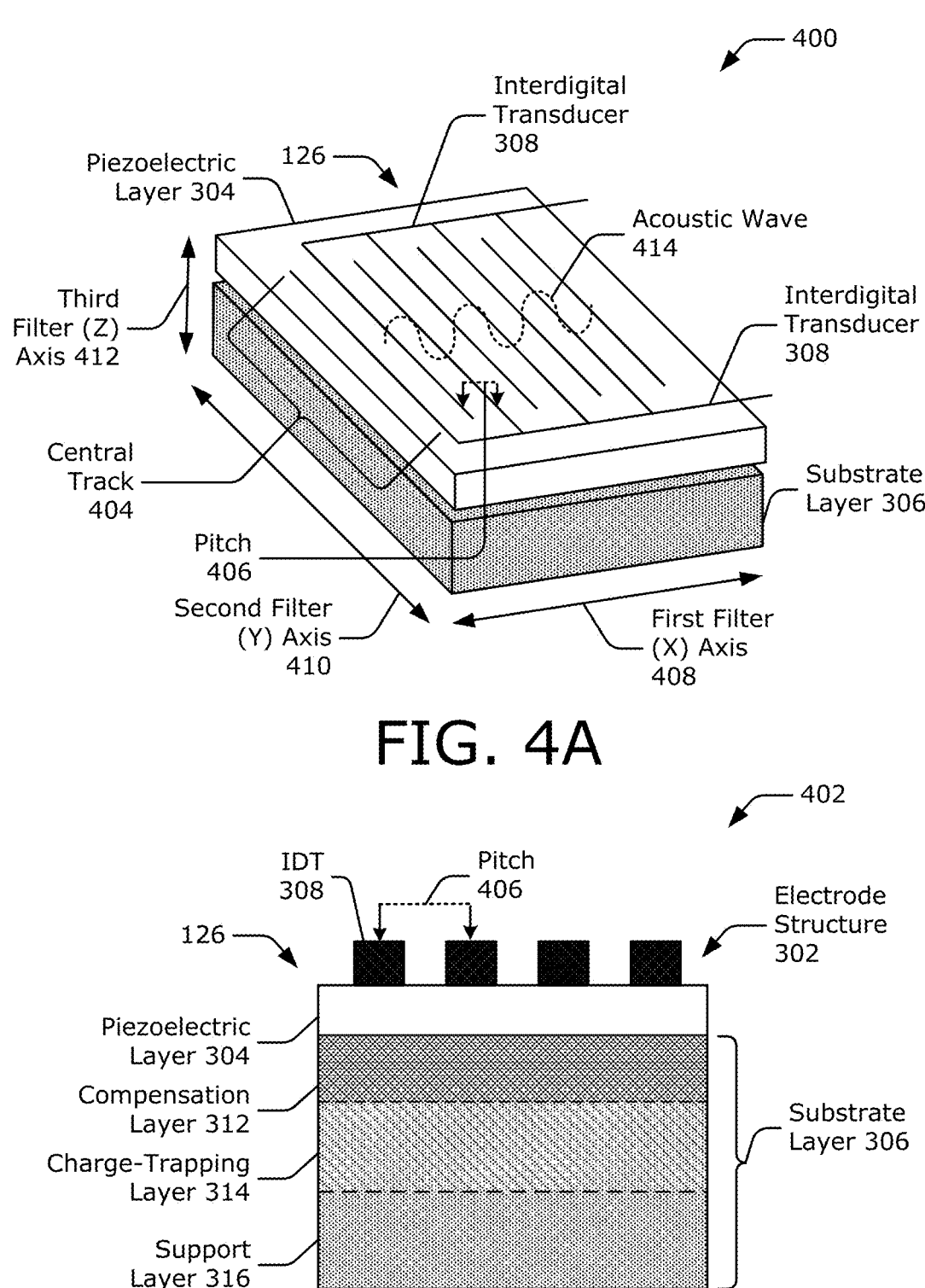
FIGS. 4A and 4B illustrate an example implementation of a SAW resonator in accordance with aspects described herein.

FIGS. 4A and 4B illustrate an example implementation of the TFSAW resonator 126 having an AlN substrate layer 306 on the piezoelectric layer 304. A three-dimensional perspective view 400 of the TFSAW resonator 126 is shown in FIG. 4A, and a two-dimensional cross-section view 402 of the TFSAW resonator 126 is shown in FIG. 4B.

In the depicted configuration shown in the two-dimensional cross-section view 402, the piezoelectric layer 304 is disposed between the electrode structure 302 and the substrate layer 306. FIG. 4A shows a single AlN substrate layer, but in some implementations, the substrate layer 306 can include sublayers as described above, such as the compensation layer 312, the charge-trapping layer 314, and the support layer 316, with the AlN substrate layer included as described below in FIG. 6, 8, or 10. The compensation layer 312 is disposed between the piezoelectric layer 304 and the charge-trapping layer 314. The charge-trapping layer 314 is disposed between the compensation layer 312 and the support layer 316. The electrode structure 302 includes the interdigital transducer 308. Although not explicitly shown in FIGS. 4A and 4B, the electrode structure 302 can also include one or more other interdigital transducers 308 and two or more reflectors.

In the three-dimensional perspective view 400, the interdigital transducer 308 is shown to have two comb-shaped electrode structures with fingers extending from two busbars (e.g., conductive segments or rails) towards each other. The electrode fingers are arranged in an interlocking manner in between the two busbars of the interdigital transducer 308 (e.g., arranged in an interdigitated manner). In other words, the fingers connected to a first busbar extend towards a second busbar but do not connect to the second busbar. As such, there is a gap between the ends of these fingers and the second busbar. Likewise, fingers connected to the second busbar extend towards the first busbar but do not connect to the first busbar. There is therefore a gap between the ends of these fingers and the first busbar.

In the direction along the busbars, there is an overlap region including a central region 404 where a portion of one finger overlaps with a portion of an adjacent finger. This central region 404, including the overlap, may be referred to as the aperture, track, or active region where electric fields are produced between fingers to cause an acoustic wave 414 to form at least in this region of the piezoelectric layer 304.

A physical periodicity of the fingers is referred to as a pitch 406 of the interdigital transducer 308. The pitch 406 may be indicated in various ways. For example, in certain aspects, the pitch 406 may correspond to a magnitude of a distance between consecutive fingers of the interdigital transducer 308 in the central region 404. This distance may be defined, for example, as the distance between center points of each of the fingers. The distance may be generally measured between a right (or left) edge of one finger and the right (or left) edge of an adjacent finger when the fingers have uniform widths. In certain aspects, an average of distances between adjacent fingers of the interdigital transducer 308 may be used for the pitch 406.

The frequency at which the piezoelectric layer 304 vibrates is a main-resonance frequency of the stack including the electrode structure 302 of the resonator 126 (e.g., as illustrated in FIG. 4A from the perspective view 400, where the entire stack of the resonator 126 vibrates at a resonance from the surface down and into the AlN layer of the substrate). The frequency is determined at least in part by the pitch 406 of the interdigital transducer 308 and other properties of the thin-film surface-acoustic-wave resonator 126. As an example, the pitch 406 can be approximately between 0.30 and 0.45 micrometers (μm) to enable the thin-film surface-acoustic-wave resonator 126 to have a main-resonance frequency of approximately 5 GHz. Other pitches 406 are also possible to realize other main-resonance frequencies. Other example pitches 406 can be approximately between 0.3 and 3.0 μm. In various implementations, the pitch 406 of a given implementation may be matched to a thickness of the TFSAW resonator 126 layers. For example, the thickness of the substrate layer 306 or a given sublayer of the substrate layer 306 can be set as an approximate (e.g., limited by manufacturing variation) ratio of the pitch 406 to give a particular frequency performance.

In one aspect, a thickness of the electrode structure 302 can be characterized by the pitch 406. For example, a ratio of the thickness of the electrode structure 302 to twice the pitch 406 can be approximately eight percent (e.g., hmet/2 or approximately 0.08 or 8%, illustrated as 7.5% of (h/2p), which equals 150 nm in an example below). Similarly, a thickness of the piezoelectric layer 304 can also be characterized by the pitch 406 of the electrode structure 302. For example, a ratio of the thickness of an AlN substrate layer can be four times a pitch 406 (e.g., twice a wavelength of the acoustic wave excited by the IDT fingers). Likewise, a thickness of the compensation layer 312 or of any other layer in a TFSAW stack can be characterized by the pitch 406 of the electrode structure 302.

It should be appreciated that while a certain number of fingers are illustrated in FIGS. 4A and 4B, the number of actual fingers and lengths and width of the fingers and busbars may be different in an actual implementation. Such parameters depend on the particular application and desired filter characteristics. In addition, the thin-film surface-acoustic-wave resonator 126 can include multiple interconnected electrode structures each including multiple interdigital transducers 308 to achieve a desired passband (e.g., multiple interconnected resonators or interdigital transducers 308 in series or parallel connections to form a desired filter transfer function).

Although not shown, each reflector within the electrode structure 302 can have two busbars and a grating structure of conductive fingers that each connect to both busbars. In some implementations, the pitch of the reflector can be similar to or the same as the pitch 406 of the interdigital transducer 308 to reflect the acoustic wave 414 in the resonant frequency range.

In the three-dimensional perspective view 400, the thin-film surface-acoustic-wave resonator 126 is defined by a first filter (X) axis 408, a second filter (Y) axis 410, and a third filter (Z) axis 412. The first filter axis 408 and the second filter axis 410 are parallel to a planar surface of the piezoelectric layer 304, and the second filter axis 410 is perpendicular to the first filter axis 408. The third filter axis 412 is normal (e.g., perpendicular) to the planar surface of the piezoelectric layer 304. The busbars of the interdigital transducer 308 are oriented to be parallel to the first filter axis 408. The fingers of the interdigital transducer 308 are orientated to be parallel to the second filter axis 410. Also, an orientation of the piezoelectric layer 304 causes an acoustic wave 414 to mainly form in a direction of the first filter axis 408. As such, the acoustic wave 414 forms in a direction that is substantially perpendicular to the direction of the fingers of the interdigital transducer 308.

The acoustic wave 414 can be, for example, a shear horizontally-polarized wave. The shear horizontally-polarized wave can enable the thin-film surface-acoustic-wave resonator 126 to realize a high electroacoustic coupling.

During operation, the thin-film surface-acoustic-wave resonator 126 accepts a radio-frequency signal, such as the pre-filter transmit signal 224 or the pre-filter receive signal 230 shown in FIG. 2. The electrode structure 302 excites an acoustic wave 414 on the piezoelectric layer 304 using the inverse piezoelectric effect. For example, the interdigital transducer 308 in the electrode structure 302 generates an alternating electric field based on the accepted radio-frequency signal. The piezoelectric layer 304 enables the acoustic wave 414 to be formed in response to the alternating electric field generated by the interdigital transducer 308. In other words, the piezoelectric layer 304 causes, at least partially, the acoustic wave 414 to form responsive to electrical stimulation by one or more interdigital transducers 308.

The acoustic wave 414 propagates across the piezoelectric layer 304 and interacts with the interdigital transducer 308 or another interdigital transducer within the electrode structure 302 (not shown in FIG. 4A or 4B). The acoustic wave 414 that propagates can be a standing wave. In some implementations, two reflectors within the electrode structure 302 cause the acoustic wave 414 to be formed as a standing wave across a portion of the piezoelectric layer 304. In other implementations, the acoustic wave 414 propagates across the piezoelectric layer 304 from the interdigital transducer 308 to another interdigital transducer.

Using the piezoelectric effect, the electrode structure 302 is used as described above to filter radio frequency signals associated with the propagated surface acoustic wave 414. In particular, the piezoelectric layer 304 generates an alternating electric field due to the mechanical stress generated by the propagation of the acoustic wave 414. The alternating electric field induces an alternating current in the other interdigital transducers (e.g., the interdigital transducer 308). This alternating current forms the filtered radio-frequency signal, which is provided at an output of the thin-film surface-acoustic-wave resonator 126. In some aspects, resonators can have multiple electric ports, or a single port described by an admittance value. The filtered radio-frequency signal can include the filtered transmit signal 226 or the filtered receive signal 232 of FIG. 2.

Figure 5:
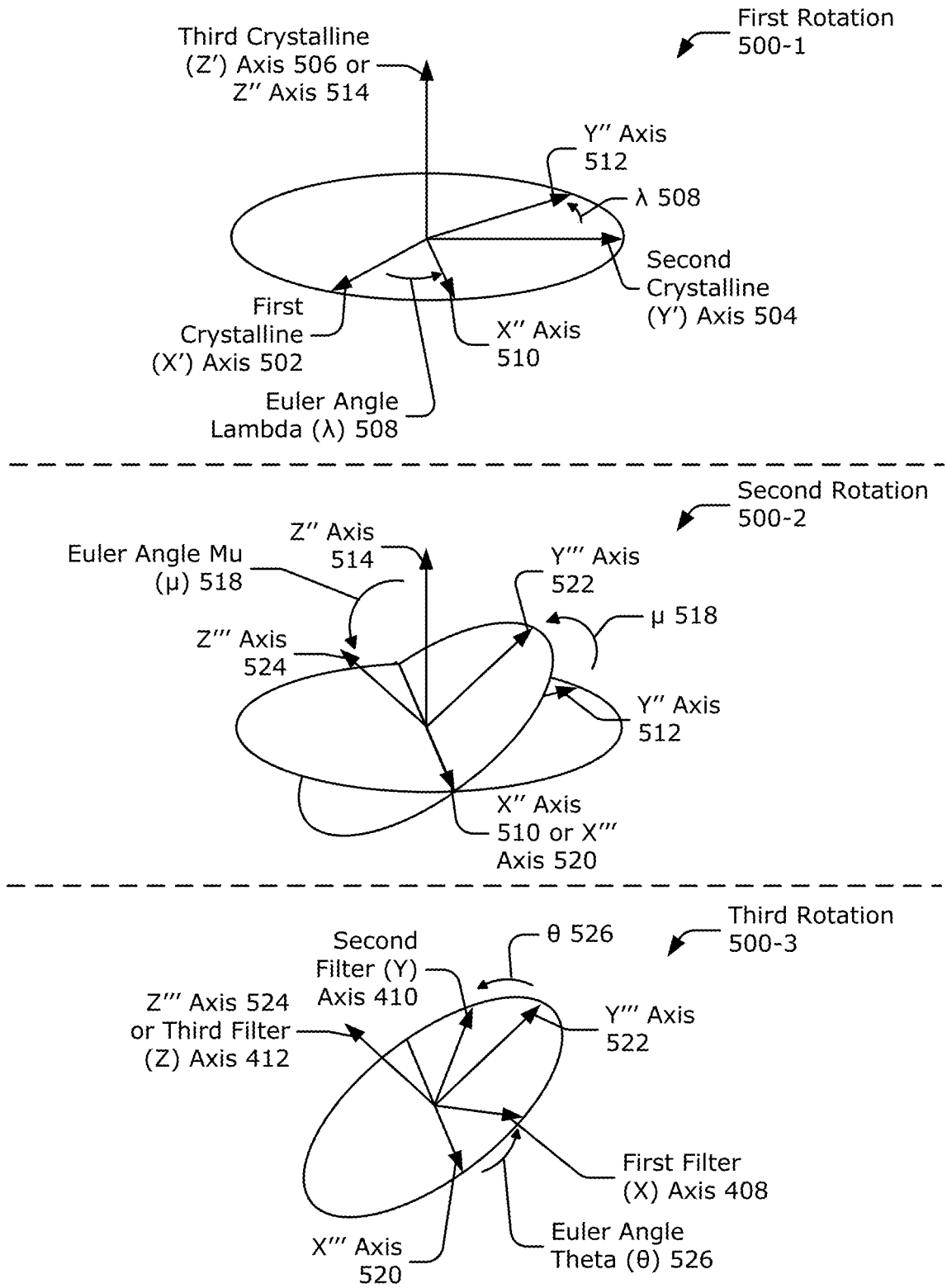
FIG. 5 illustrates example Euler angles that define an orientation of a crystalline structure of a piezoelectric material in a SAW resonator in accordance with aspects described herein.

FIG. 5 illustrates example Euler angles 310 (of FIG. 3) that define an orientation of the piezoelectric material crystalline structure in the piezoelectric layer 304 of the TFSAW resonator 126. A first crystalline (X') axis 502, a second crystalline (Y') axis 504, and a third crystalline (Z') axis 506 are fixed along crystallographic axes of a crystal (e.g., LT). A first rotation 500-1 is applied to rotate the first crystalline X' axis 502 and the second crystalline Y' axis 504 about the third crystalline Z' axis 506. In particular, the first rotation 500-1 rotates the first crystalline X' axis 502 in a direction of the second crystalline Y' axis 504. The angle associated with the first rotation 500-1 characterizes one of the Euler angles 310, which is represented by Euler angle lambda ($\lambda$) 508. The resulting rotated axes are represented by a new set of axes: an X" axis 510, a Y" axis 512, and a Z" axis 514. As shown in FIG. 5, the third crystalline Z' axis 506 remains unchanged by the first rotation 500-1 such that the third crystalline Z' axis 506 is equal to the Z" axis 514.

In a second rotation 500-2, the Y" axis 512 and the Z" axis 514 are rotated about the X" axis 510 by another Euler angle 310, which is represented by Euler angle mu ($\mu$) 518. In this case, the Y" axis 512 is rotated in the direction of the Z" axis 514. The resulting rotated axes are represented by a new set of axes: an X''' axis 520, a Y''' axis 522, and a Z''' axis 524. As shown in FIG. 5, the X" axis 510 remains unchanged by the second rotation 500-2 such that the X" axis 510 is equal to the X''' axis 520.

In a third rotation 500-3, the X''' axis 520 and the Y''' 522 axis are rotated about the Z''' axis 524 by an additional Euler angle 310, which is represented by Euler angle theta ($\theta$) 526. In this case, the X''' axis 520 is rotated in the direction of the Y''' axis 522. The resulting rotated axes are represented by the filter axes of FIGS. 4A and 4B (e.g., the first filter X axis 408, the second filter Y axis 410, and the third filter Z axis 412). As shown in FIG. 5, the Z''' axis 524 remains unchanged by the third rotation 500-3 such that the Z''' axis 524 is equal to the third filter Z axis 412. The X axis 408 specifies the direction of formation of the acoustic wave 414.

As described above, aspects described herein can use any number of standard Euler angles, such as those for lithium tantalate (LiTaO3/LT) 15, LT20, LT30, LT36, LT39, LT42, LT46.3, LT50, LT25, and the like. In some aspects as indicated above, the corresponding LT cuts may be chosen from LT10 . . . LT50, or LTxx with ten less than xx and xx less than approximately 50 (e.g., 10≤~xx≤~50). In some aspects, the Euler angles can be intentionally modified to shift the mu ($\mu$) angle away from the standard angle to modify and adjust excitation of parasitic modes and to limit resonance spikes in TFSAW resonator operation. In some aspects, the third angle $\theta$ may also be varied by rotating the lithography mask used during fabrication to optimize operation for low losses in a particular implementation. In general, a variation in any of the Euler angles 310 can be set by given manufacturing process tolerances, which in some aspects can be a variation less than or equal to +/−1.5°, and in other aspects, a variation in any of the Euler angles 310 is less than or equal to +/−0.2°. Therefore, the term approximately can mean that any of the Euler angles can be within +/−1.5° of a specified value or less (e.g., within +/−0.2° of a specified value).

In FIG. 4A, an orientation of the first filter X axis 408, the second filter Y axis 410, and the third filter Z axis 412 relative to a substrate layer (e.g., an AlN layer, which may be used to implement the support layer 316), can similarly be defined by other Euler angles.

Figure 6:
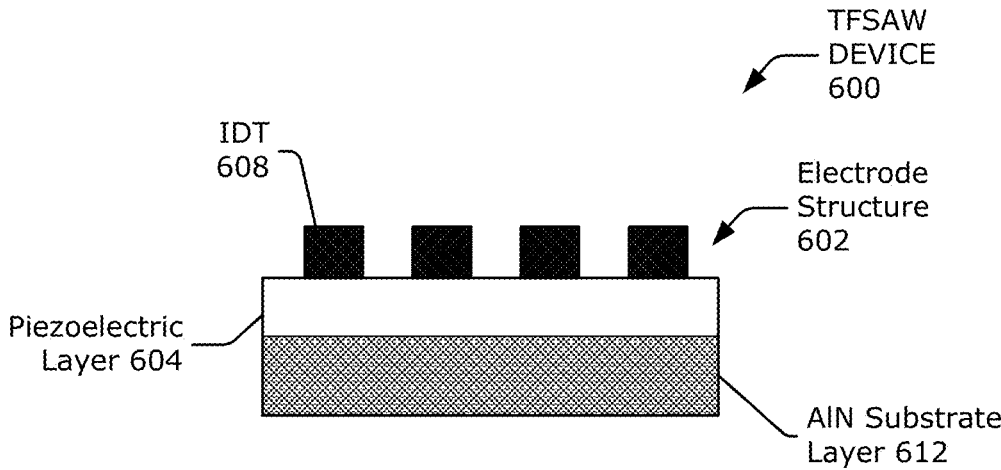
FIG. 6 illustrates aspects of a SAW device in accordance with aspects described herein.

FIG. 6 illustrates aspects of TFSAW resonator 600 in accordance with aspects described herein. The TFSAW resonator 600 can be an implementation of the TFSAW resonator 126 discussed above. The TFSAW resonator 600 includes an electrode structure 602 comprising interdigital transducer(s) 608 having an associated pitch characteristic defined by the space between fingers of the IDTs 608. The IDTs 608 are positioned on top of a piezoelectric layer 604, which can be an LT layer, an LN layer, or any other suitable piezoelectric layer with resonance characteristics associated with Euler angles as described above and configured for excitation of surface thin film modes and suppression of spurious modes of resonator operation to support a given wireless communication band. The piezoelectric layer is positioned on top of an AlN substrate layer 612. The AlN substrate layer 612 operates as a fast layer to keep the electroacoustic wave confined primarily to the piezoelectric layer 604 (e.g., an LT layer) with limited spurious (e.g., leakage) modes for the electroacoustic wave of the TFSAW resonator 600.

The AlN substrate layer 612 can be formed of a single crystal AlN structure, a deposited film AlN structure, or a ceramic AlN structure. The properties of the TFSAW will depend on the properties of the AlN substrate layer, which can vary greatly depending on the AlN structure as well as the configuration of the piezoelectric layer 604. In some aspects, such fabrication flexibility can provide improvements in a device related to device fabrication. For example, existing deposition techniques used for bulk acoustic wave (BAW) resonators can be used, in some aspects, for deposition of an AlN substrate layer in accordance with some aspects.

Figure 7:
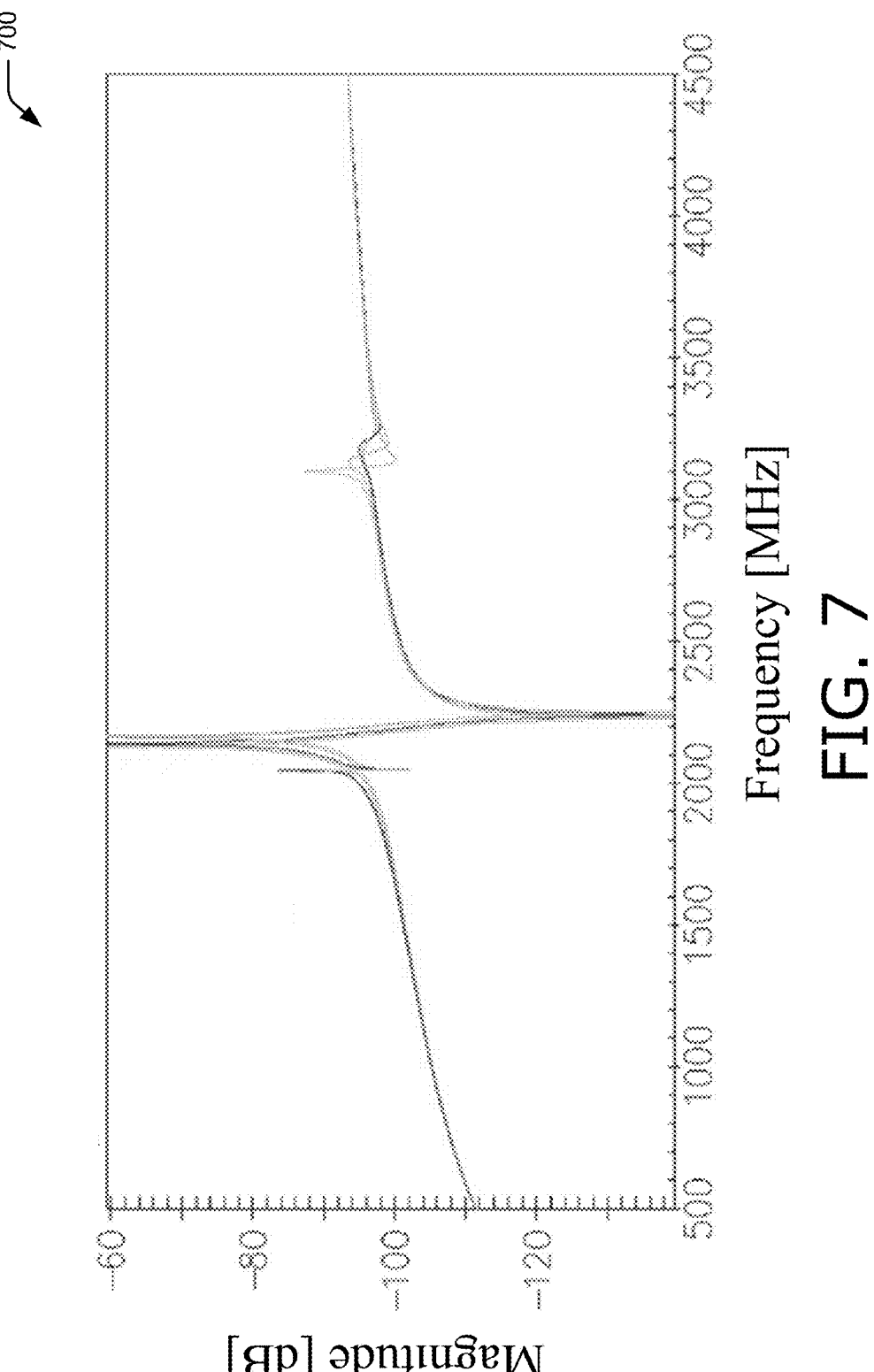
FIG. 7 depicts a graph that illustrates various example performance characteristics of some described SAW resonators having an Aluminum Nitride layer in accordance with aspects described herein.

Rayleigh mode visible slightly below the main resonance and another spur at ~3 GHz), which are significantly influenced by changing the Euler angles of the LT in the TFSAW structure with AlN. In FIG. 7, results are shown for 350 nmLT, a pitch of 1.0 μm, metallization ratio eta=0.55 and hmet=150 nm.

FIG. 7 along with FIGS. 9A, 9B, and 11A-D show simulation examples for admittances of a resonator structure with a pitch of 1 μm for different LT cuts with a 350 nm LT piezo thickness. These FIGS. illustrate that a design can select an LT cut such that the spur below resonance is minimized (e.g., LT-42), or such that the 3 GHz spike is reduced.

Figure 8:
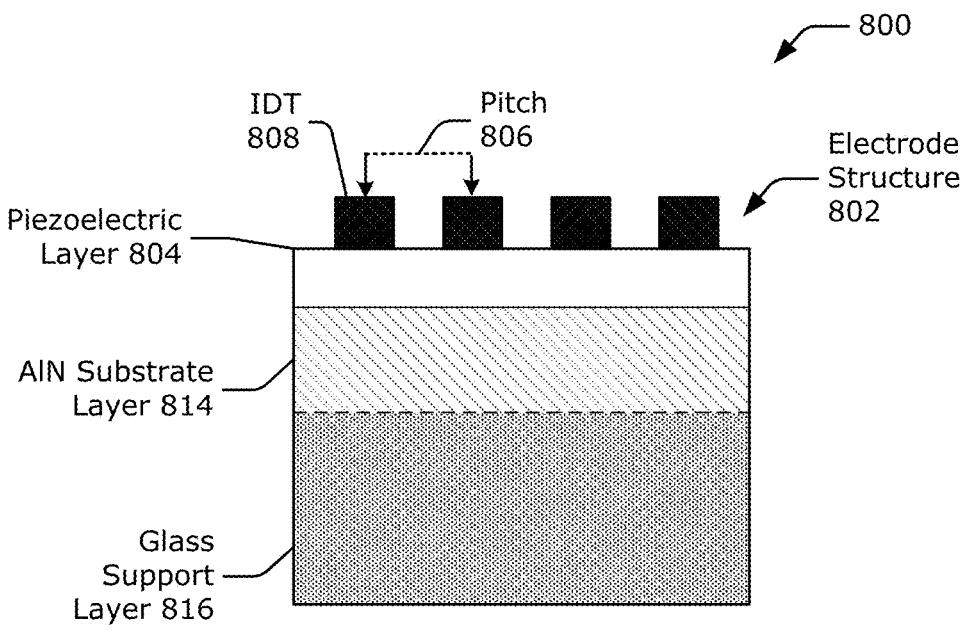
FIG. 8 illustrates aspects of a SAW device in accordance with aspects described herein.

FIG. 8 illustrates aspects of TFSAW device 800 in accordance with aspects described herein. The TFSAW device 800 can be an implementation of the TFSAW resonator 126 discussed above. The TFSAW device 800 includes an electrode structure 802 comprising interdigital transducer(s) 808 having an associated pitch 806 characteristic defined by the space between fingers of the IDTs 808. The IDTs 808 are

TABLE 1

| Material | Young's Modulus (E) | v (m/s) | Density (kg/m³) | Stiffness C11 (N/m³) | Stiffness C44 (N/m³) | Stiffness C12 (N/m³) | $v_1$ (m/s) | $v_{sh}$ (m/s) |
|---|---|---|---|---|---|---|---|---|
| AlN Amorph | 251 | 0.255 | 3512 | 30.4 | 10 | 10.4 | 9303.78 | 5336.09 |
| AlN Poly | 315 | 0.25 | 3260 | 37.8 | 12.6 | 12.6 | 10768.05 | 6216.94 |
| AlN Hakiki (crystal) | 296 | 0.233 | 3260 | 34.5 | 12 | 10.5 | 10287.28 | 6067.11 |
| AlN ceramics | 344 | 0.255 | 3280 | 41.67 | 13.71 | 14.26 | 11271.99 | 6464.06 |
| AlN ceramics (Krosaki) | 320 | 0.27 | 3200 | 39.99 | 12.6 | 14.79 | 11178.43 | 6274.56 |

Table 1 above illustrates example properties of an AlN structure that can be used in an AlN substrate layer 612. Table 1 includes details for an amorphous AlN layer, a poly-structure AlN layer, a crystalline AlN structure, and two possible ceramic AlN structures. The expected performance shown illustrates sufficiently high volume wave onset (e.g., Vsh around 5300-6200 m/s). As illustrated, the Young's modulus (E) value for the high onset stiff ceramic structures is relatively high (e.g., the two lower rows), resulting in a wave velocity (Vsh) significantly higher than for the other AlN structures. With the lower velocity provided by amorphous AlN, a 500 nanometer LT piezoelectric layer 604 can be used with an amorphous AlN substrate layer 612 at a thickness of several microns to generate a resonator response with acceptable spur performance.

While table 1 and the examples herein describe AlN structures, other structures are possible within the context of the aspects described herein. For example, in some aspects Aluminum Scandium Nitride (AlScN) or doped AlScN can be used in place of or in addition to AlN structures. Such AlScN structures can, for example, operate with Vsh values in a range of approximately 5400 m/s, providing benefits comparable to the AlN aspects described herein.

FIG. 7 depicts a graph 700 that illustrate various example performance characteristics of implementations of the TFSAW resonator(s) 600 of FIG. 6, illustrating the impact of design variations of a TFSAW having an Aluminum Nitride layer in accordance with aspects described herein. The graph 700 illustrates that there are two spurious modes (e.g., a disposed over a piezoelectric layer 804, which can be an LT layer, an LN layer, or any other suitable piezoelectric layer with resonance characteristics associated with Euler angles as described above and configured for excitation of surface thin film modes and suppression of spurious modes of resonator operation to support a given wireless communication band. The piezoelectric layer 804 is positioned in a layer above an AlN substrate layer 814. In some aspects, an optional SiO2 layer is positioned between the AlN substrate layer 814 and the piezoelectric layer 804 as described below in FIG. 10. In other aspects, the piezoelectric layer 804 is positioned directly on a surface of the AlN substrate layer 814 as illustrated in FIG. 8.

Similar to the description above, the AlN substrate layer 814 operates as a fast layer that operates to keep the electroacoustic wave confined to the piezoelectric layer 804. The AlN substrate thus limits leakage into parasitic modes that result in unwanted spurs and signal loss for selected wireless communication frequency bands.

In the example of FIG. 8, the AlN substrate layer 814 is positioned on a glass support layer 816. In other aspects, the glass support layer 816 can be any suitable support layer configured as a support for the AlN substrate layer 814. In some aspects, rather than glass, a layer of ceramic AlN can be used as a support, or the entire support and AlN substrate layer 814 can be combined as a single bulk AlN layer (e.g., similar to FIG. 6 above). As described herein, a thermal expansion coefficient (e.g., parts per million per degree Kelvin or Celsius of temperature change) of a glass support substrate can be selected by doping or particular fabrication of the glass. As described above, this can provide a specific temperature expansion coefficient that is matched to the piezoelectric layer or other layer of a TFSAW stack to provide stable performance at high power and/or high temperature operating conditions. In particular, because mismatched thermal expansion coefficients in TFSAW stack layers can result in a bowing or size shift of a TFSAW. Such a bowing or device shift can change the pitch of the IDT electrode fingers, shifting the device performance, which depends on the IDT pitch as detailed herein. Further, glass can provide manufacturing benefits associated with larger wafer size for a supporting substrate, lower costs, and other such device benefits. For example, a six inch glass wafer can be used in TFSAW fabrication at a much lower cost than other supporting substrate materials, which may only be available at smaller wafer sizes.

Figure 9A:
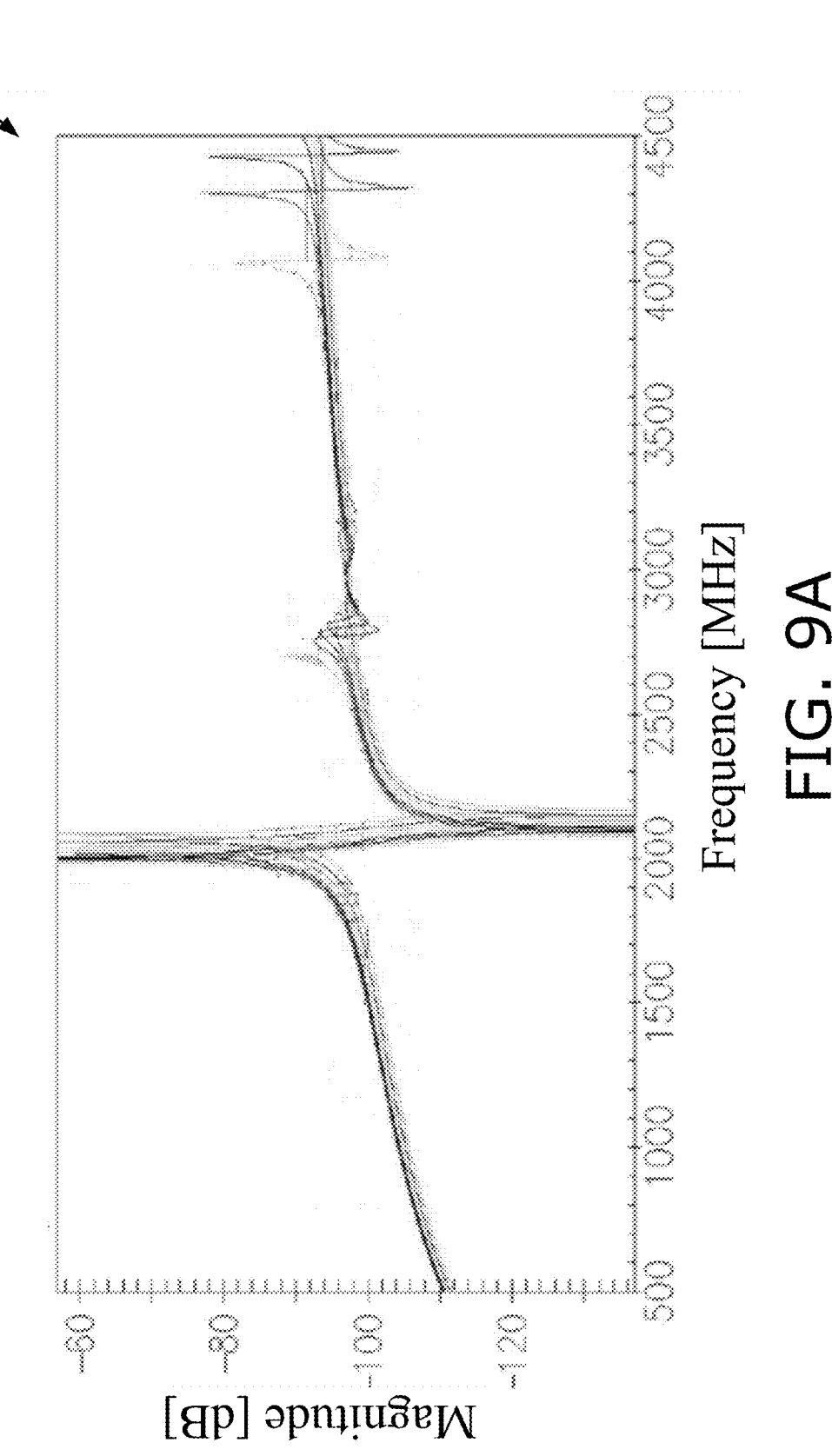
FIGS. 9A-B depict graphs that illustrate various example performance characteristics of some described SAW resonators having an Aluminum Nitride layer in accordance with aspects described herein.
Figure 9B:
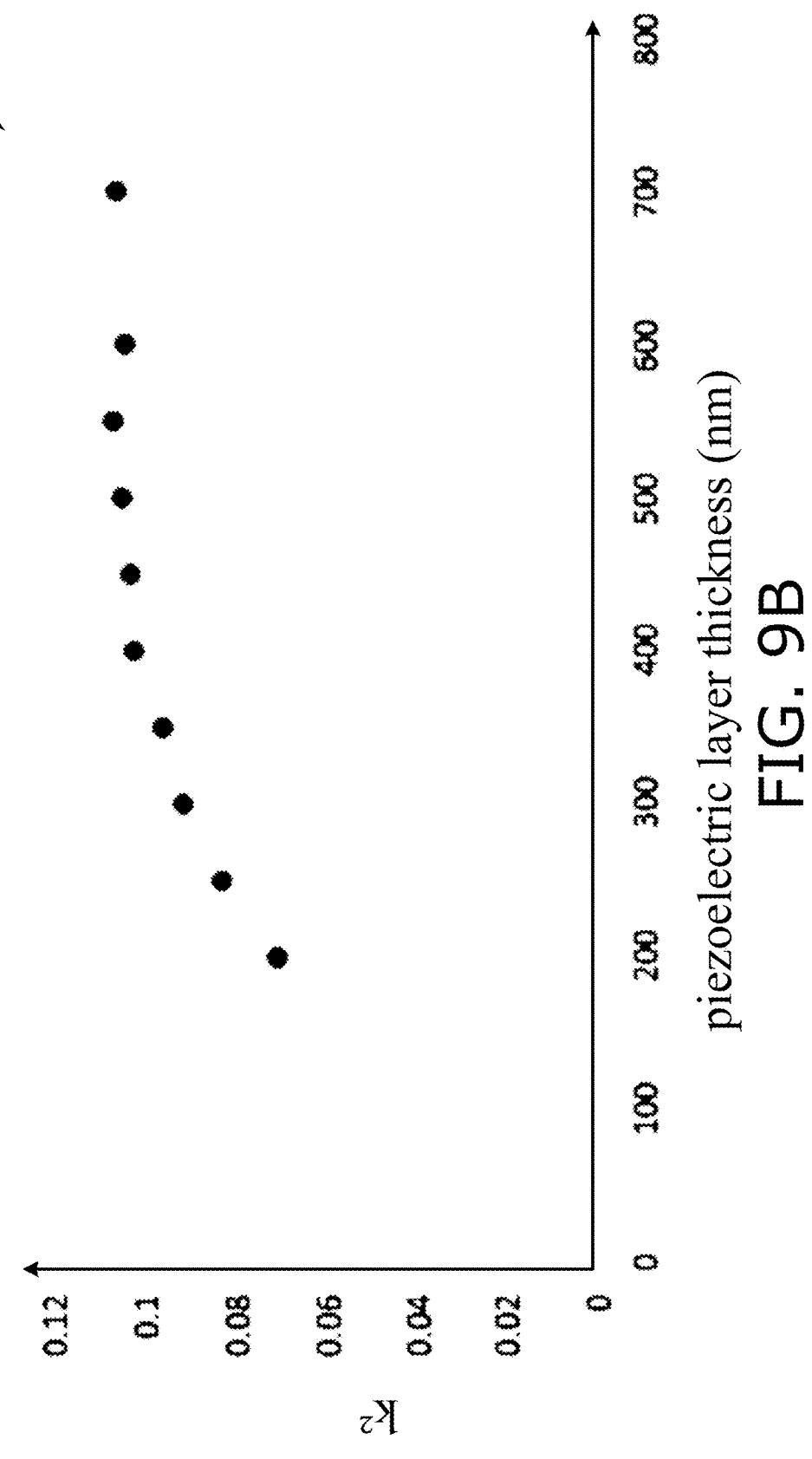

FIGS. 9A and 9B depict graphs 900A and 900B that illustrate various example performance characteristics of implementations of the TFSAW resonator device(s) 800 of FIG. 8, illustrating the impact of design variations of a TFSAW having an Aluminum Nitride layer in accordance with aspects described herein. Graphs 900A and 900B illustrate aspects implemented with a piezoelectric layer made of LT with a 42rotYX cut (LT42) Euler angle, an electrode layer pitch of 1 micrometer (um) and a 3 micrometer layer of amorphous AlN as an AlN substrate layer in accordance with aspects described herein. The lines of graph 900A illustrate frequency operation for a piezoelectric layer thickness varying from 200 nanometers to 700 nanometers. The illustrated graph 900A shows a main resonance around 2 gigahertz (GHz). The graph 900B shows the coupling value ($K^2$) charted against the piezoelectric layer thickness. A coupling value as high as possible is preferable in some aspects, and the graph 900B shows a highest coupling performance when the piezoelectric layer is greater than approximately 400 nanometers.

As described herein, layer thicknesses will depend on relative geometries, so that as interdigital transducer (IDT) pitches vary, the relative thickness of the other layers (e.g., the piezoelectric layer) will change proportionally to achieve similar performance. In accordance with graphs 900A-B, in some aspects, a piezoelectric layer on an AlN substrate will have a thickness greater than 0.4 of the IDT pitch for acceptable performance.

In the illustrated graph 900A, admittance curves show a simulation of LT42 with variations of piezoelectric layer thickness on 3 micrometer (μm) thick AlN, a structure without SiO2, and on glass and related electroacoustic coupling. The graph 900B shows a $k^2$ value on the y-axis charted against the piezoelectric layer thickness. In some aspects, for p=1 μm, a piezoelectric thickness of at least ~400 nm is used for target resonator performance. Since additional spurious modes occur at higher frequencies with a thicker piezoelectric layer as shown in graphs 900A from 4 to 4.5 GHz. Graph 900B illustrates the benefit of a high $k^2$ value for a piezoelectric layer thickness of 400 nm and above, but for higher piezoelectric layer thicknesses the benefits of a slightly higher $k^2$ value are outweighed by the drawbacks of the additional spurious modes that occur with the thicker piezoelectric layer.

Figure 10:
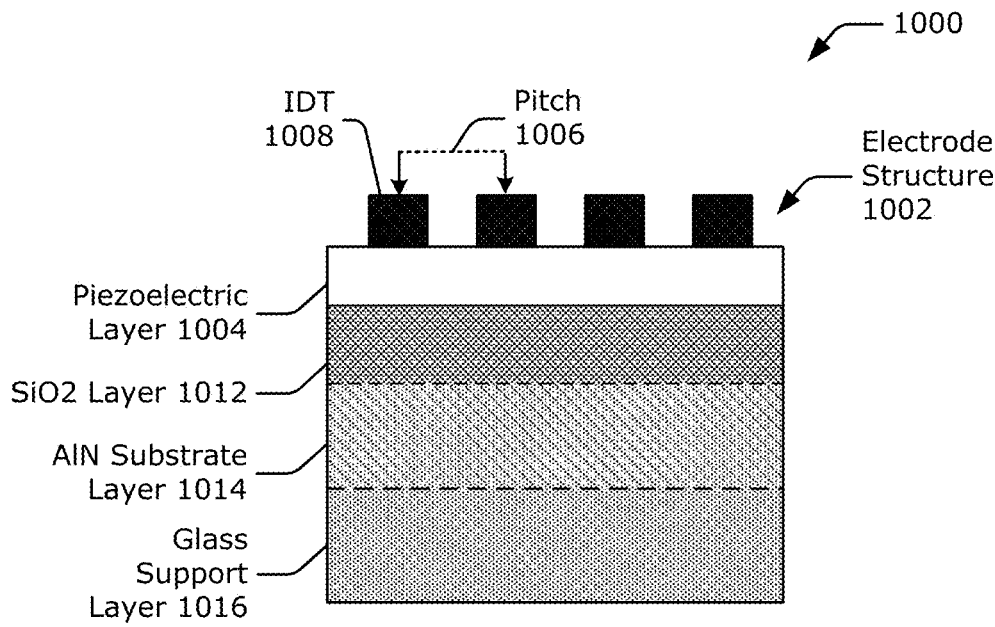
FIG. 10 illustrates aspects of a SAW device in accordance with aspects described herein.

FIG. 10 illustrates aspects of TFSAW device 1000 in accordance with aspects described herein. The TFSAW device 1000 can be an implementation of the TFSAW resonator 126 discussed above. The TFSAW device 1000 includes an electrode structure 1002 comprising interdigital transducer(s) 1008 having an associated pitch 1006 characteristic defined by the space between fingers of the IDTs 1008. The IDTs 1008 are positioned on top of a piezoelectric layer 1004, which can be an LT layer, an LN layer, or any other suitable piezoelectric layer with resonance characteristics associated with Euler angles as described above and configured for excitation of surface thin film modes and suppression of spurious modes of resonator operation to support a given wireless communication band. The piezoelectric layer 1004 is positioned in a layer above an AlN substrate layer 1014. In the example of FIG. 10, the SiO2 layer 1012 is positioned between the AlN substrate layer 1014 and the piezoelectric layer 1004. In other aspects, the piezoelectric layer 1004 is positioned directly on a surface of the AlN substrate layer 1014.

Similar to the description above, the AlN substrate layer 1014 operates as a fast layer that operates to keep the electroacoustic wave confined to the piezoelectric layer 1004 and the SiO2 layer 1012. The AlN substrate thus limits leakage into parasitic modes that result in unwanted spurs and signal loss for selected wireless communication frequency bands.

In the example of FIG. 10, the AlN substrate layer 1014 is positioned on a glass support layer 1016. The glass support layer 1016 can be amorphous SiO2 in some aspects. In other aspects, the glass support layer 1016 can be any suitable support layer configured as a support for the AlN substrate layer 1014. In some aspects, rather than glass, a layer of ceramic AlN can be used as a support, or the entire support and AlN substrate layer 1014 can be combined as a single bulk AlN layer (e.g., similar to FIG. 6 above).

Figure 11A:
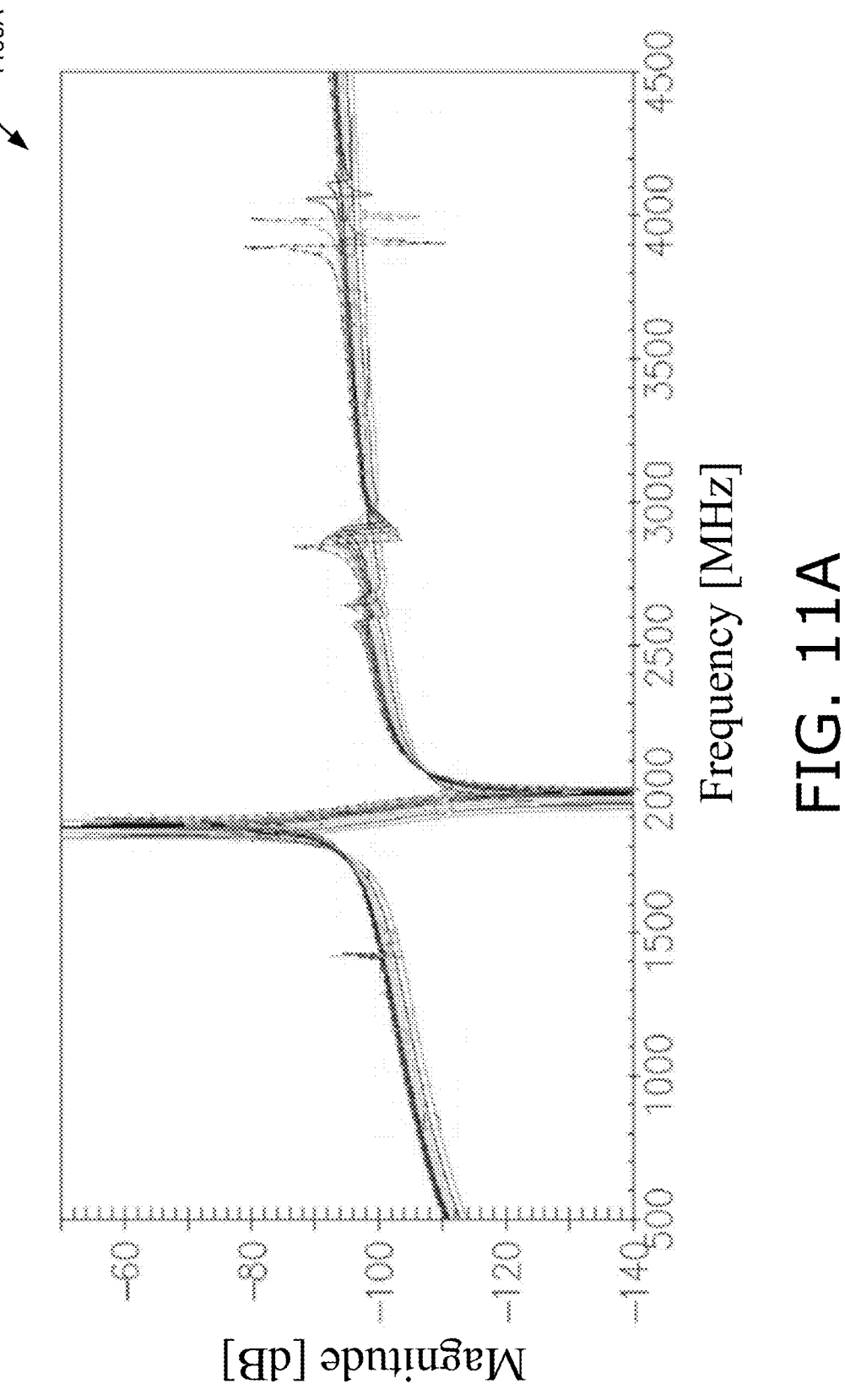
FIGS. 11A-11D depict graphs that illustrate various example performance characteristics of some described SAW resonators having an Aluminum Nitride layer in accordance with aspects described herein.
Figure 11B:
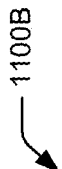
Figure 11B:
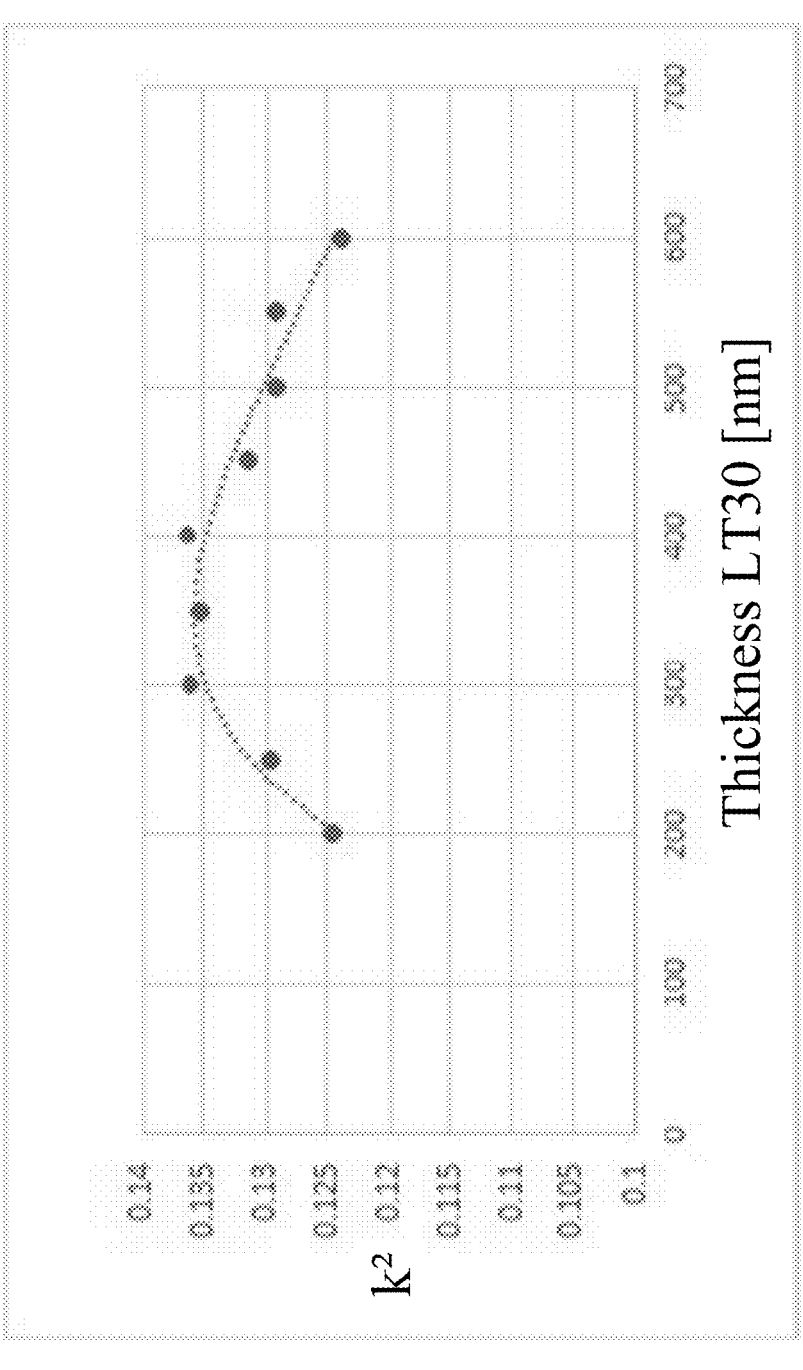

FIGS. 11A and 11B depict graphs 1100A and 1100B that illustrate various example performance characteristics of implementations of the TFSAW resonator device(s) 1000 of FIG. 10, illustrating the impact of design variations of a TFSAW having an Aluminum Nitride layer in accordance with aspects described herein. Graphs 1100A and 1100B illustrate aspects implemented with a piezoelectric layer made of LT with a 30rotYX cut, an electrode layer pitch of 1 micrometer (um), a 500 nanometer SiO2 layer, and a 3 micrometer layer of amorphous AlN as an AlN substrate layer in accordance with aspects described herein. The lines of graph 1100A illustrate frequency operation for a piezoelectric layer varying from 200 nanometers to 600 nanometers. The illustrated graph 1100A shows a main resonance around 2 gigahertz (GHz), and that static Capacitance Cs is lower for less thick piezoelectric layers. Graph 1100A also shows Cs influencing the filter structure size, with improved performance for a higher value Cs, resulting in a performance trade-off between additional spurs and improved performance associated with the higher Cs value.

The graph 1100B shows the coupling value ($K^2$) charted against the piezoelectric layer thickness. A coupling value as high as possible is preferable in some aspects, and the graph 1100B shows a highest coupling performance when the piezoelectric layer is between approximately 300 and 400 nanometers.

Figure 11C:
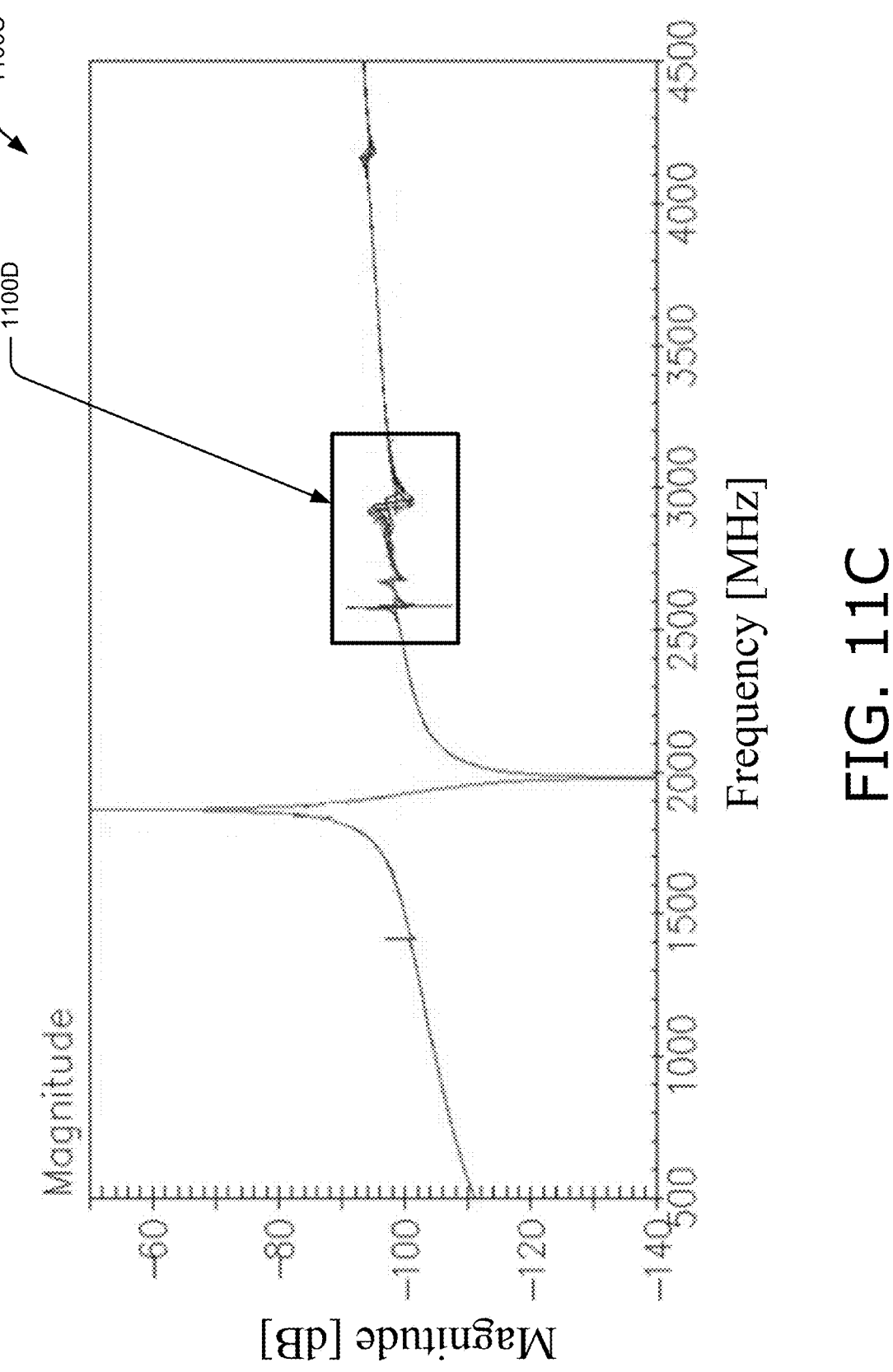

FIG. 11C shows graph 1100C for frequency response characteristics for another implementation with the LT30, the 1 um pitch, the 500 nm SiO2 layer, and a 400 nm piezoelectric layer corresponding to the details of graphs 1100A-B above. In FIG. 11C, the graph 1100C shows different frequency response characteristics as the AlN substrate layer is varied from 2.5 um to 5 μm. The graph 1100C includes a spur area 1100D where the AlN thickness layer impacts spur peaks in the spur area 1100D. Further, the graph 1100C illustrates simulation results for the max $k^2$ structure with p=1 μm, when AlN thickness is varied. The AlN thickness has low influence on main mode, but some on spurs as illustrated in FIG. 11D.

Figure 11D:
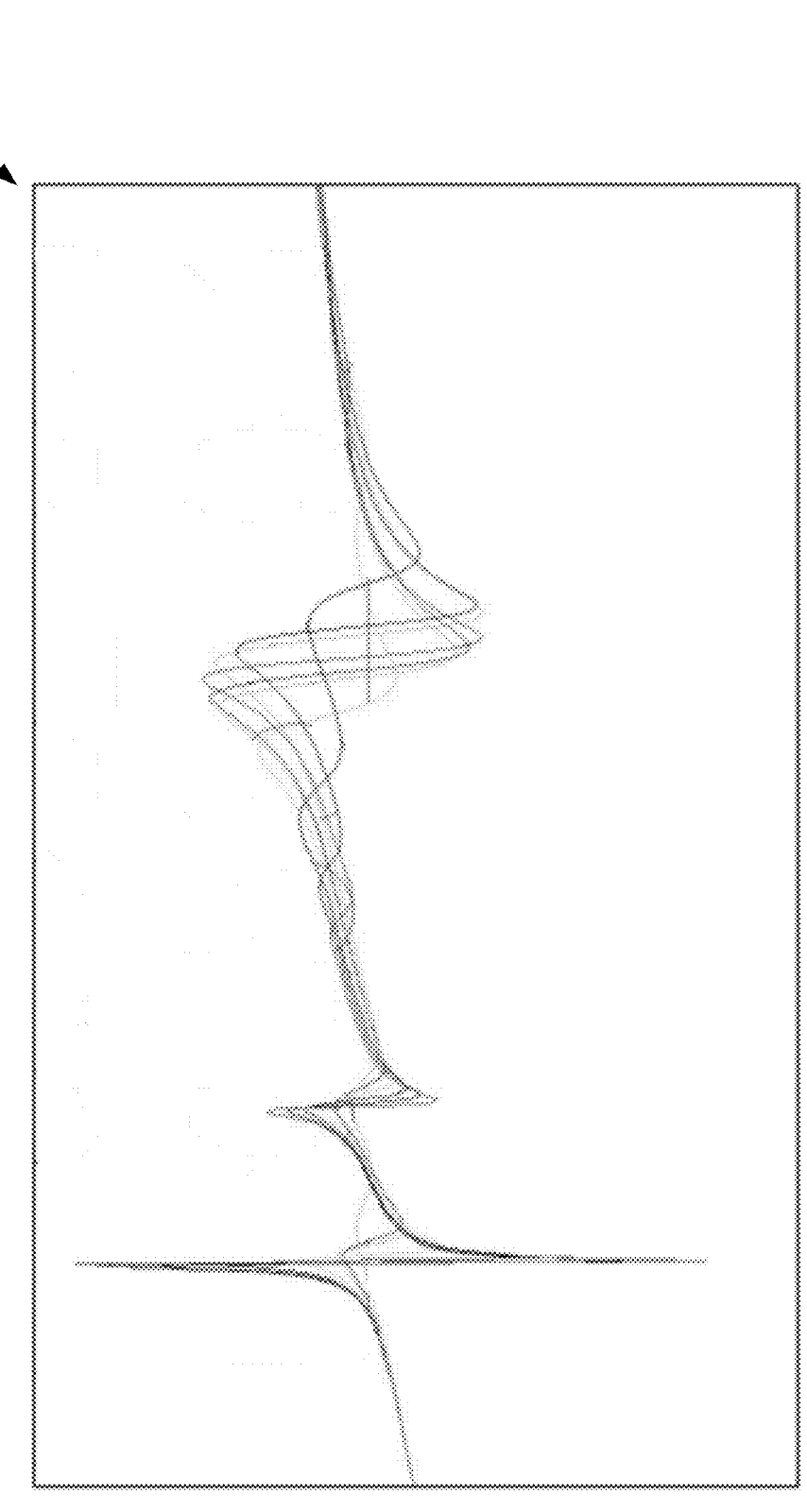

FIG. 11D shows the spur area 1100D of the graph 1100C in an enlarged form. As illustrated, at AlN substrate thicknesses greater than 4 μm, a large peak develops at approximately 2.6 GHz, while a peak around 2.9 GHz shrinks slightly. In some aspects, an AlN substrate layer in accordance with the details of the implementation above will operate with improved performance at an AlN substrate thickness less than 3.5 um due to the smaller spur at 2.6 GHz and the relatively similar sized spur at 2.9 GHz.

As indicated above, layer thicknesses will depend on relative geometries, so that as interdigital transducer (IDT) pitches vary, the relative thickness of the other layers (e.g., the piezoelectric layer) will change proportionally to achieve similar performance. In accordance with graphs 1100A-D, in some aspects, a piezoelectric layer on an AlN substrate will have a thickness of approximately 0.3 to 0.4 of the IDT pitch, and the AlN substrate will have a thickness less than 3.5 of the IDT pitch.

The above examples describe particular implementations of a TFSAW resonator using an AlN substrate layer. As described herein, other TFSAW resonators with an AlN substrate layer are possible, while performance of lithium tantalate (LiTaO₃/LT) at particular Euler angles are described, other piezoelectric materials and other Euler angles may be used in some aspects. For example, in some aspects, LT15, LT20, LT25, LT30, LT36, LT39, LT42, LT46.3 or LT50 may be used. For each such material and material configuration, corresponding thicknesses of different layers, including AlN substrate layer, may be selected for corresponding performance characteristics associated with a particular application. The description above uses, for example, LT30 as an abbreviation for lithium tantalate at Euler angle (0, −60, 0). Such angles have equivalent angles as described above. Additionally, the Euler angle can vary within approximately 1 degree for the third angle, 5 or 10 degrees for the third angle, or other such ranges based on manufacturing variations or other design variations. Similarly, any angles can be adjusted based on the particular design characteristics desired for a particular application.

In accordance with aspects described herein thin film (TF) SAW resonators are sensitive to Euler angle configuration. In TFSAW resonators, shear polarized waves can be excited and propagate at the surface of the structure. If the confinement (e.g., fast) layer below the piezoelectric layer is not properly chosen, the wave can suffer losses, which impact the Q value of a TFSAW resonator. With TFSAW structures, the losses into the bulk supporting materials can be suppressed in certain frequency ranges, up to a volume wave onset frequency for a carrier structure (e.g., Vsh). In accordance with aspects described herein, this can be the Vsh of the AlN substrate layer.

Figure 12A:
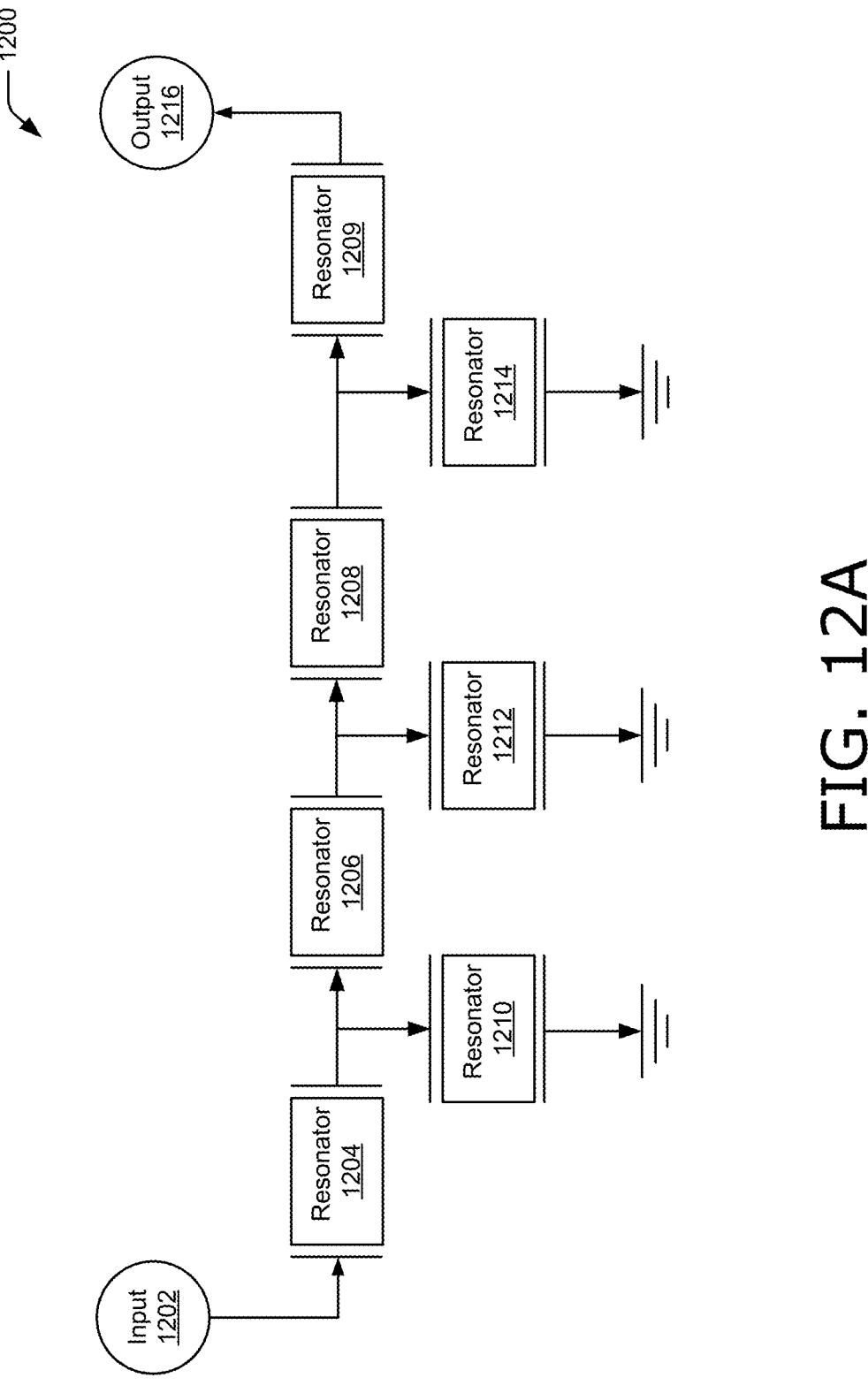
FIGS. 12A and 12B illustrate aspects of SAW use in a wireless communication apparatus in accordance with aspects described herein.

FIG. 12A is a schematic diagram of an electroacoustic filter circuit 1200 that includes one or more TFSAW resonators with an AlN substrate layer in accordance with aspects described herein (e.g., to implement a filter for a wireless communication signal). The example of FIG. 12A includes a ladder structure. In other examples, other structures can be used. The filter circuit 1200 provides one example of where a TFSAW resonator with an AlN substrate layer in accordance with aspects described herein can provide improved performance due to improved thermal performance and high power performance, as well as lower cost and manufacturing improvements as described above. The filter circuit 1200 includes an input 1202 and an output 1216. Between the input 1202 and the output 1216 a ladder network of resonators is provided. The resonators can be SAW resonators or any other such resonator device as detailed herein (e.g., BAW etc.), including at least one TFSAW resonator with an AlN substrate layer in accordance with aspects described herein. The filter circuit 1200 includes a first resonator 1204, a second resonator 1206, a third resonator 1208, and a fourth resonator 1209 all electrically connected in series between the input 1202 and the output 1216. A fifth resonator 1210 (e.g., a shunt resonator) has a first terminal connected between the first resonator 1204 and the second resonator 1206 and a second terminal connected to a ground potential. A sixth resonator 1212 (e.g., shunt resonator) has a first terminal connected between the second resonator 1206 and the third resonator 1208 and a second terminal connected to a ground potential. Seventh resonator 1214 similarly has a first terminal connected between third resonator 1208 and fourth resonator 1209, and a second terminal connected to a ground potential (e.g., either directly or using additional circuitry, such as an inductor or other connecting circuitry coupled to the ground potential). The electroacoustic filter circuit 1200 may, for example, be a band pass circuit having a passband within a selected frequency range (e.g., approximately between 100 MHz and 3.5 GHz).

Figure 12B:
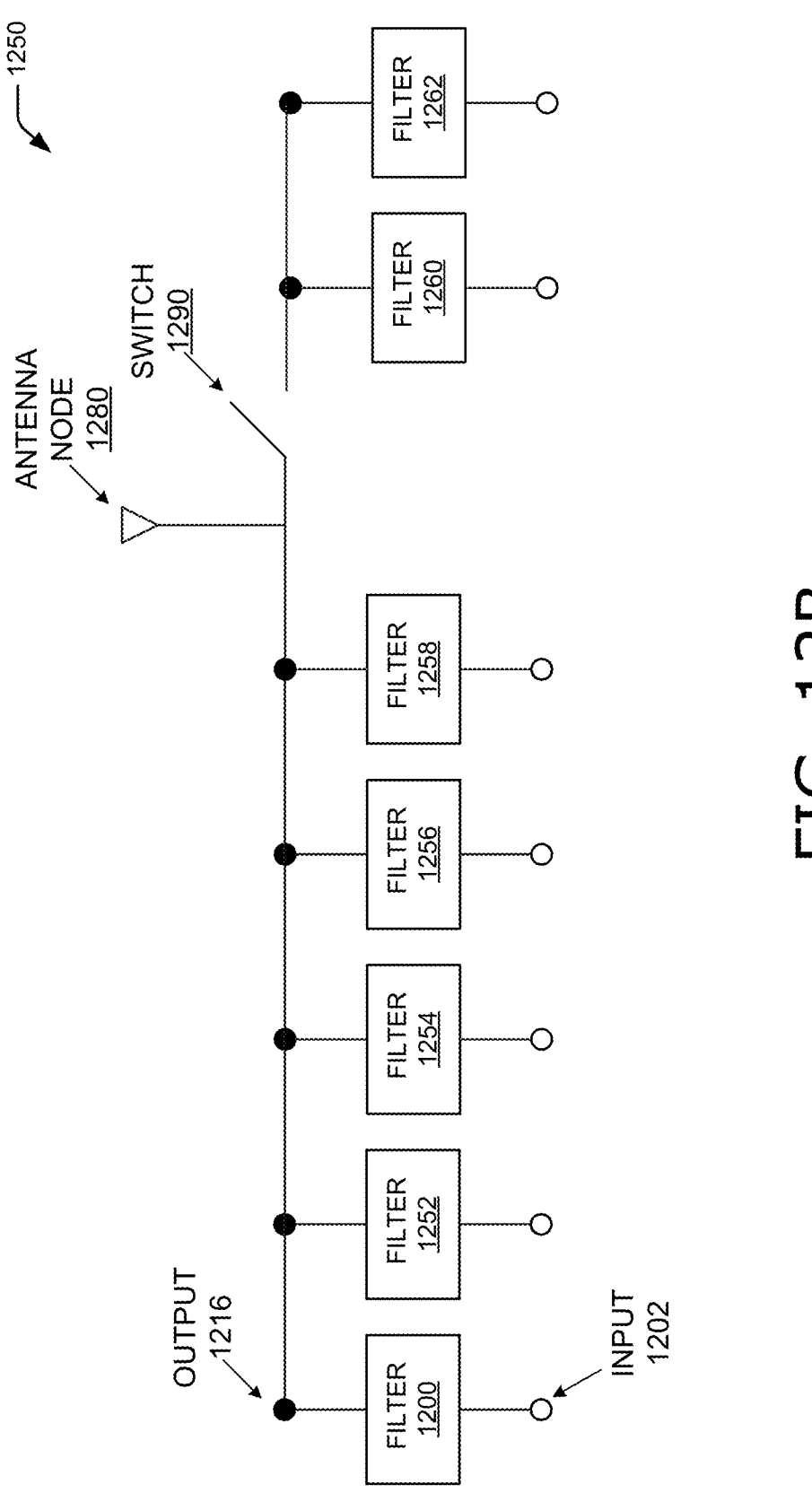

FIG. 12B is a schematic representation of a multiplexer circuit 1250 with multiple filters configured for multi-band communications using antenna node 1280. The filters include filter circuit 1200 from FIG. 12A, including output 1216 and input 1202. Additional filters 1252, 1254, 1256, 1258, 1260, and 1262 are shown, which can be used for corresponding bands of the multi-band communications. Other examples can include multiplexing with any number of filters. Switch 1290 can isolate filters 1260 and 1262 from the remaining filters when the frequency bands associated with filters 1260 and 1262 are not in use. Isolating filters 1260 and 1262 can improve the communication performance of multiplexer circuit 1250 by limiting interference by filters 1260 and 1262 with signals from filters (or filter circuits) 1200-1258 when filters 1260 and 1262 are not in use (e.g., signal loss due to leakage into filters 1260 and 1262 is limited when filters 1260 and 1262 are disconnected by the switch). Other examples may include additional switches to create additional groupings of filters that can be isolated by the switches. Further examples may include no switches, so that all of the filters can be hard-wired at an antenna node as part of the multiplexer circuitry.

Figure 13A:
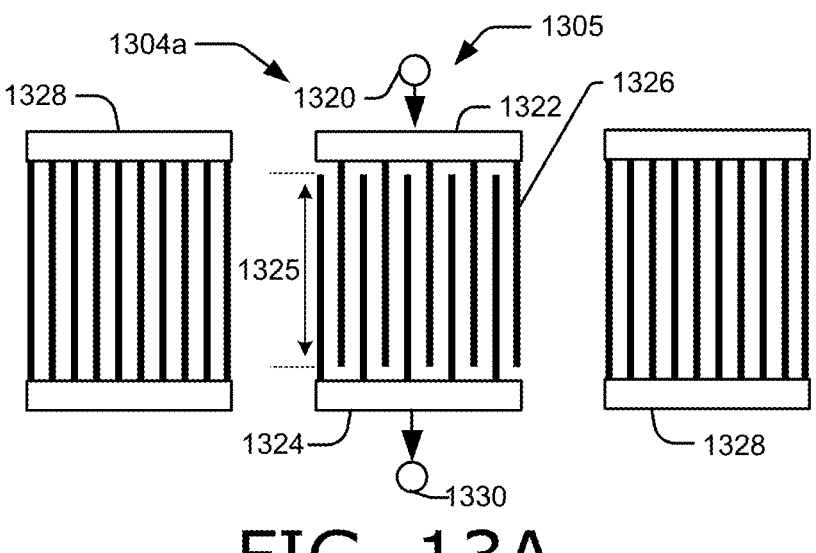
FIGS. 13A and 13B illustrate an example implementation of a SAW resonator in accordance with aspects described herein.
Figure 13B:
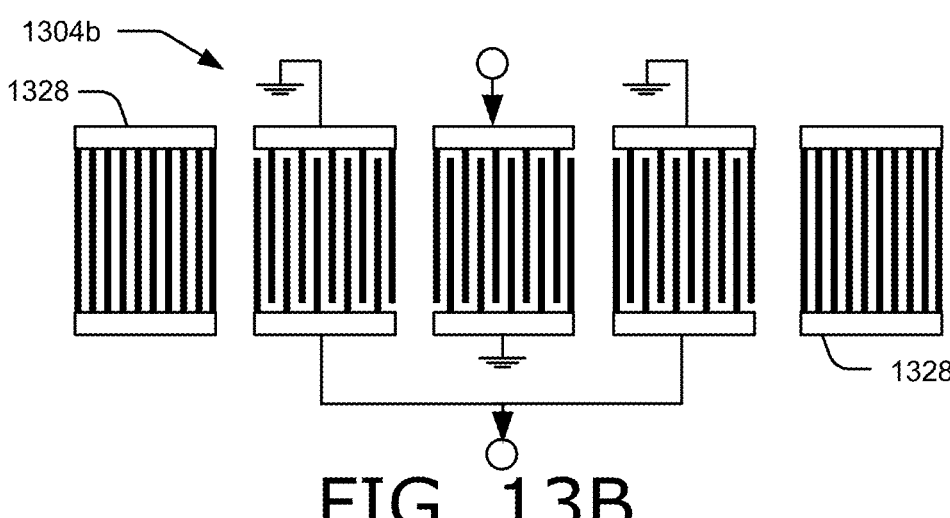

FIG. 13A is a high level representation of a top view of an example of an electrode structure 1304a of an electroacoustic device. FIGS. 13A and 13B provide details of reflectors briefly described, but not shown, in FIGS. 4A and 4B. The structures of FIGS. 13A and 13B can be used to implement additional aspects of a TFSAW resonator with an AlN substrate layer as described herein (e.g., the TFSAW resonator 126.) The electrode structure 1304a has an IDT 1305 that includes a first busbar 1322 (e.g., first conductive segment or rail) electrically connected to a first terminal 1320 and a second busbar 1324 (e.g., second conductive segment or rail) spaced from the first busbar 1322 and connected to a second terminal 1330. A plurality of conductive fingers 1326 are connected to either the first busbar 1322 or the second busbar 1324 in an interdigitated manner. Fingers 1326 connected to the first busbar 1322 extend towards the second busbar 1324 but do not connect to the second busbar 1324 so that there is a small gap between the ends of these fingers 1326 and the second busbar 1324. Likewise, fingers 1326 connected to the second busbar 1324 extend towards the first busbar 1322 but do not connect to the first busbar 1322 so that there is a small gap between the ends of these fingers 1326 and the first busbar 1322.

In the direction along the busbars, there is an overlap region including a central region where a portion of one finger overlaps with a portion of an adjacent finger as illustrated by the central region 1325. This central region 1325 including the overlap may be referred to as the aperture, track, or active region where electric fields are produced between fingers 1326 to cause an acoustic wave to propagate in this region of the piezoelectric layer. The periodicity of the fingers 1326 is referred to as the pitch of the IDT. The pitch may be indicted in various ways. For example, in certain aspects, the pitch may correspond to a magnitude of a distance between fingers in the central region 1325. This distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 1304a. The frequency is determined at least in part by the pitch of the IDT 1305 and other properties of the electroacoustic device.

The IDT 1305 is arranged between two reflectors 1328 which reflect the acoustic wave back towards the IDT 1305 for the conversion of the acoustic wave into an electrical signal via the IDT 1305 in the configuration shown and to prevent losses (e.g., confine and prevent escaping acoustic waves). Each reflector 1328 has two busbars and a grating structure of conductive fingers that each connect to both busbars. The pitch of the reflector may be similar to or the same as the pitch of the IDT 1305 to reflect acoustic waves in the resonant frequency range. But many configurations are possible.

A variety of electrode structures are possible. FIG. 13A may generally illustrate a one-port configuration. Other configurations with several ports are also possible as described herein. For example, the electrode structure 1304a may have an input IDT 1305 where each terminal 1320 and 1330 functions as an input. In this case, an adjacent output IDT (not illustrated) that is positioned between the reflectors 1328 and adjacent to the input IDT 1305 may be provided to convert the acoustic wave propagating in the piezoelectric layer to an electrical signal to be provided at output terminals of the output IDT.

FIG. 13B is a diagram of a top view of another example of an electrode structure 1304b of an electroacoustic device. In this case, a dual-mode SAW (DMS) electrode structure 1304b is illustrated that is a structure which may induce multiple resonances. The electrode structure 1304b includes multiple IDTs along with reflectors 1328 connected as illustrated. The electrode structure 1304b is provided to illustrate the variety of electrode structures that principles described herein may be applied to including the electrode structures 1304a and 1304b of FIGS. 13A and 13B.

It should be appreciated that while a certain number of fingers 1326 are illustrated, the number of actual fingers and lengths and width of the fingers 1326 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

FIG. 14 is a flow diagram illustrating an example process 1400 performed to fabricate a TFSAW resonator (e.g., the TFSAW resonator 126). The process 1400 is described in the form of a set of blocks that specify operations that can be performed. However, operations are not necessarily limited to the order shown in FIG. 14 or described herein, for the operations may be implemented in alternative orders or in fully or partially overlapping manners. Also, more, fewer, and/or different operations may be implemented to perform the process 1400, or an alternative process.

The process 1400 includes block 1402, which includes forming a substrate layer comprising an Aluminum Nitride (AlN) substrate layer. The process 1400 further includes block 1404, which includes forming a piezoelectric layer on a top surface of substrate layer, where a crystalline structure of the piezoelectric layer is defined by Euler angles lambda ($\lambda$), mu ($\mu$), and theta ($\theta$). The process 1400 further includes block 1406, which includes forming an electrode layer on a top surface of the piezoelectric layer, where the substrate layer and the piezoelectric layer are configured for excitation of surface waves, and where the AlN substrate layer is configured as a fast layer to limit excitation of spurious waves. While the above blocks are illustrated in a particular order, the process 1400 can include intervening blocks, steps, or operations. Further, blocks to allow fabrication of any structure described herein, or to configure elements of a resonator in accordance with the descriptions herein can be part of implementations of the process 1400.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more" of a set does not limit the set to the items listed in the set. For example, claim language reciting "at least one of A and B" or "at least one of A or B" may mean A, B, or A and B, and may additionally include items not listed in the set of A and B. The phrases "at least one" and "one or more" are used interchangeably herein.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y, and Z, or that multiple processors are each tasked with a certain subset of operations X, Y, and Z such that together the multiple processors perform X, Y, and Z, or that a group of multiple processors work together to perform operations X, Y, and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

The following is a set of non-limiting aspects in accordance with the details provided herein:

Aspect 1. A surface acoustic wave (SAW) resonator comprising: a substrate layer comprising an Aluminum Nitride (AlN) substrate layer, an electrode structure comprising an interdigital transducer, and a piezoelectric layer disposed between the electrode structure and the substrate layer.

Aspect 2. The SAW resonator of Aspect 1, where the substrate layer and the piezoelectric layer are configured for excitation of surface waves, and where the AlN substrate layer is configured as a fast layer to confine the wave energy to the top of the structure and to limit excitation of spurious surface waves.

Aspect 3. The SAW resonator of any of Aspects 1 through 2, where a thickness of the substrate layer is proportional to a pitch value for fingers of the interdigital transducer.

Aspect 4. The SAW resonator of any of Aspects 1 through 3, where the AlN substrate layer is a single crystal AlN layer.

Aspect 5. The SAW resonator of any of Aspects 1 through 3, where the AlN substrate layer is a ceramic AlN layer.

Aspect 6. The SAW resonator of any of Aspects 1 through 5, where the AlN substrate layer is fabricated as a non-piezoelectric layer using ceramic material and unordered polycrystalline AlN or amorphous AlN.

Aspect 7. The SAW resonator of any of Aspects 1 through 6, where the AlN substrate layer is a deposited thin film layer.

Aspect 8. The SAW resonator of Aspect 7, where the AlN substrate layer is a Scandium doped thin film layer configured to adjust a velocity ($v_{sh}$) value.

Aspect 9. The SAW resonator of any of Aspects 7 through 8, where the substrate layer further comprises a glass support layer with the AlN substrate layer disposed between the piezoelectric layer and the glass support layer.

Aspect 10. The SAW resonator of any of Aspects 1 through 6, where the substrate layer further comprises a glass support layer, where the AlN substrate layer is disposed between the glass support layer and the piezoelectric layer.

Aspect 11. The SAW resonator of Aspect 10, where the glass support layer is doped to match a thermal expansion coefficient of the glass support layer to a thermal expansion coefficient of the piezoelectric layer.

Aspect 12. The SAW resonator of Aspect 10, where the glass support layer is formed of amorphous SiO2.

Aspect 13. The SAW resonator of Aspect 10, where the glass support layer is formed of crystalline SiO2.

Aspect 14. The SAW resonator of any of Aspects 1 through 13, where piezoelectric layer comprises lithium tantalate (LT) or lithium niobate (LN), where a crystalline structure of the piezoelectric layer is defined by Euler angles lambda ($\lambda$), mu ($\mu$), and theta ($\theta$).

Aspect 15. The SAW resonator of Aspect 14, where the p value is in a range from −80 degrees to −30 degrees.

Aspect 16. The SAW resonator of Aspect 14, where the piezoelectric layer is in a configuration selected from LT0 through LT 60.

Aspect 17. The SAW resonator of Aspect 14, where the piezoelectric layer is in a configuration selected from LT25 through LT 50.

Aspect 18. The SAW resonator of Aspect 14, where a thickness of the piezoelectric layer is approximately 0.4 times a pitch value for fingers of the interdigital transducer.

Aspect 19. The SAW resonator of Aspect 14, where a thickness of the piezoelectric layer is between 0.2 and 0.8 times a pitch value for fingers of the interdigital transducer.

Aspect 20. The SAW resonator of any of Aspects 1 through 19, where a thickness of the AlN substrate layer is less than four times the pitch value.

Aspect 21. The SAW resonator of any of Aspects 1 through 20, further comprising an SiO2 compensation layer between the piezoelectric layer and the AlN substrate layer.

Aspect 22. The SAW resonator of Aspect 21, where the SiO2 compensation layer is approximately between 0.2 and 0.8 a pitch value for fingers of the interdigital transducer.

Aspect 23. The SAW resonator of any of Aspects 1 through 13, where the piezoelectric layer comprises of lithium tantalate, and where the Euler angle is selected from a set of lithium tantalate Euler angles including of LT15, LT20, LT30, LT36, LT39, LT42, LT46.3, and LT50.

Aspect 24. The resonator of any of Aspects 1 through 23, where the piezoelectric layer and the interdigital transducer is configured to excite a particular shear polarized wave mode.

Aspect 25. A surface acoustic wave (SAW) filter apparatus comprising: a substrate layer comprising an Aluminum Nitride (AlN) substrate layer, an electrode structure comprising an interdigital transducer, the interdigital transducer having an input, an output, and a central track, and a piezoelectric layer disposed between the electrode structure and the substrate layer, where a crystalline structure of the piezoelectric layer is defined by Euler angles lambda ($\lambda$), mu ($\mu$), and theta ($\theta$), where the substrate layer and the piezoelectric layer are configured for excitation of selected electroacoustic wave modes confined by the AlN substrate layer to limit excitation of spurious wave modes in a stack structure of the SAW filter apparatus.

Aspect 26. The SAW filter apparatus of Aspect 25, where the piezoelectric layer comprises Lithium Tantalate, and where the Euler angles for the piezoelectric layer are selected in a range from LT0 through LT60.

Aspect 27. A surface acoustic wave (SAW) resonator comprising: a glass support layer, a substrate layer disposed on the glass support layer, the substrate layer comprising an Aluminum Nitride (AlN) substrate layer, a fast layer disposed on the AlN substrate layer, an electrode structure comprising an interdigital transducer, and a piezoelectric layer disposed between the electrode structure and the fast layer.

Aspect 28. The SAW resonator of Aspect 27, wherein the slow layer is a silicon oxide (SiO$_2$) layer.

Aspect 29. The SAW resonator of any of Aspects 27 through 28, further comprising a scandium doped Aluminum Nitride layer (AlScN) layer disposed between the substrate layer and the piezoelectric layer.

Aspect 30. A method comprising: forming a substrate layer comprising an Aluminum Nitride (AlN) substrate layer, forming a piezoelectric layer on a top surface of substrate layer, where a crystalline structure of the piezoelectric layer is defined by Euler angles lambda ($\lambda$), mu ($\mu$), and theta ($\theta$), and forming an electrode layer on a top surface of the piezoelectric layer, where the substrate layer and the piezoelectric layer are configured for excitation of surface waves, and where the AlN substrate layer is configured as a fast layer to limit excitation of spurious waves.

Aspect 31. A method of forming any device according with aspects 1 through 29 above.

Aspect 32. A device comprising means for operating as a SAW resonator in accordance with any of aspects 1 through 29 above.

What is claimed is:

1. A surface acoustic wave (SAW) resonator comprising:
a substrate layer comprising an Aluminum Nitride (AlN) substrate layer,
an electrode structure comprising an interdigital transducer, and
a piezoelectric layer disposed between the electrode structure and the substrate layer,
wherein the AlN substrate layer is a deposited thin film layer and comprises a Scandium doped thin film layer.

2. The SAW resonator of claim 1, wherein the piezoelectric layer comprises lithium tantalate (LT), wherein a crystalline structure of the piezoelectric layer is defined by Euler angles lambda ($\lambda$), mu ($\mu$), and theta ($\theta$).

3. The SAW resonator of claim 2, wherein a thickness of the piezoelectric layer is approximately 0.4 times a pitch value for fingers of the interdigital transducer.

4. The SAW resonator of claim 3, wherein a thickness of the AlN substrate layer is less than four times the pitch value.

5. The SAW resonator of claim 2, wherein $\mu$ is a value in a range from −80 degrees to −30 degrees.

6. The SAW resonator of claim 2, wherein the piezoelectric layer is in a configuration selected from LT0 through LT 60.

7. The SAW resonator of claim 2, wherein the piezoelectric layer is in a configuration selected from LT25 through LT 50.

8. The SAW resonator of claim 2, wherein a thickness of the piezoelectric layer is between 0.2 and 0.8 times a pitch value for fingers of the interdigital transducer.

9. The SAW resonator of claim 1, wherein the Scandium doped thin film layer is configured to adjust a velocity ($v_{sh}$) value.

10. The SAW resonator of claim 9, wherein the substrate layer further comprises a glass support layer wherein the AlN substrate layer is disposed between the piezoelectric layer and the glass support layer.

11. The SAW resonator of claim 10, wherein the glass support layer is doped to match a thermal expansion coefficient of the glass support layer to a thermal expansion coefficient of the piezoelectric layer.

12. The SAW resonator of claim 1, wherein the substrate layer further comprises a glass support layer, wherein the AlN substrate layer is disposed between the glass support layer and the piezoelectric layer.

13. The SAW resonator of claim 12, wherein the glass support layer is formed of amorphous SiO2.

14. The SAW resonator of claim 12, wherein the glass support layer is formed of crystalline SiO2.

15. The SAW resonator of claim 1, wherein the AlN substrate layer comprises a ceramic AlN layer.

16. The SAW resonator of claim 15, wherein the AlN substrate layer is fabricated comprising a non-piezoelectric layer using ceramic material and unordered polycrystalline AlN or amorphous AlN.

17. The SAW resonator of claim 1, further comprising an SiO2 compensation layer between the piezoelectric layer and the AlN substrate layer.

18. The SAW resonator of claim 17, wherein the SiO2 compensation layer is approximately between 0.2 and 0.8 a pitch value for fingers of the interdigital transducer.

19. The SAW resonator of claim 1, wherein the substrate layer and the piezoelectric layer are configured for excitation of surface waves, and wherein the AlN substrate layer is configured as a fast layer to confine wave energy to a top surface of the SAW resonator.

20. The SAW resonator of claim 1, wherein the piezoelectric layer comprises lithium tantalate (LT) or lithium niobate (LN).

21. The SAW resonator of claim 1, wherein the AlN substrate layer comprises a single crystal AlN layer.

22. The SAW resonator of claim 1, wherein the piezoelectric layer comprises of lithium tantalate (LT), and wherein a Euler angle for the LT is selected from a set of LT Euler angles including of LT15, LT20, LT30, LT36, LT39, LT42, LT46.3, and LT50.

23. The SAW resonator of claim 1, wherein the substrate layer further comprises a glass support layer, wherein the AlN substrate layer is disposed between the glass support layer and the piezoelectric layer; and
wherein the glass support layer is doped to match a thermal expansion coefficient of the glass support layer to a thermal expansion coefficient of the piezoelectric layer.

24. A surface acoustic wave (SAW) resonator comprising:
a glass support layer,
a substrate layer disposed on the glass support layer, the substrate layer comprising an Aluminum Nitride (AlN) substrate layer,
a slow layer disposed on the AlN substrate layer,
an electrode structure comprising an interdigital transducer,
a piezoelectric layer disposed between the electrode structure and the slow layer, and a scandium doped Aluminum Nitride layer (AlScN) layer disposed between the substrate layer and the piezoelectric layer.

25. The SAW resonator of claim 24, wherein the slow layer is a silicon oxide (SiO$_2$) layer.

26. The SAW resonator of claim 24, wherein the AlScN layer is configured to adjust a velocity ($v_{sh}$) value.

27. A surface acoustic wave (SAW) filter apparatus comprising:
a substrate layer comprising an Aluminum Nitride (AlN) substrate layer, an electrode structure comprising an interdigital transducer, the interdigital transducer having an input, an output, and a central track, and a piezoelectric layer disposed between the electrode structure and the substrate layer, wherein a crystalline structure of the piezoelectric layer is defined by Euler angles lambda ($\lambda$), mu ($\mu$), and theta ($\theta$), wherein the substrate layer and the piezoelectric layer are configured for excitation of selected electroacoustic wave modes confined by the AlN substrate layer to limit excitation spurious wave modes in a stack structure of the SAW filter apparatus, wherein the AlN substrate layer is a deposited thin film layer and comprises a Scandium doped thin film layer.

28. The SAW filter apparatus of claim 27, wherein the piezoelectric layer comprises Lithium Tantalate, and wherein the Euler angles for the piezoelectric layer are selected in a range from LT0 through LT60.

* * * * *